US012119057B2

(12) United States Patent
Mousavi Iraei et al.

(10) Patent No.: US 12,119,057 B2
(45) Date of Patent: Oct. 15, 2024

(54) READ ALGORITHMS FOR THREE-DIMENSIONAL CROSSPOINT MEMORY ARCHITECTURES

(71) Applicant: Intel Corporation, Santa Clara, CA (US)

(72) Inventors: Rouhollah Mousavi Iraei, Albuquerque, NM (US); Mini Goel, Milpitas, CA (US); Raymond Zeng, Cupertino, CA (US); Hemant P. Rao, Albuquerque, NM (US)

(73) Assignee: Intel Corporation, Santa Clara, CA (US)

( * ) Notice: Subject to any disclaimer, the term of this patent is extended or adjusted under 35 U.S.C. 154(b) by 298 days.

(21) Appl. No.: 17/540,884

(22) Filed: Dec. 2, 2021

(65) Prior Publication Data

US 2023/0178148 A1    Jun. 8, 2023

(51) Int. Cl.
*G11C 13/04* (2006.01)
*G06F 3/06* (2006.01)
*G11C 13/00* (2006.01)

(52) U.S. Cl.
CPC .......... *G11C 13/004* (2013.01); *G06F 3/0625* (2013.01); *G06F 3/0653* (2013.01); *G06F 3/0679* (2013.01); *G11C 13/0004* (2013.01); *G11C 13/0023* (2013.01)

(58) Field of Classification Search
CPC .............. G11C 13/004; G11C 13/0004; G11C 13/0023; G11C 13/0026; G11C 13/0028; G11C 2013/0052; G11C 2213/76; G11C 11/5678; G06F 3/0625; G06F 3/0653; G06F 3/0679
See application file for complete search history.

(56) References Cited

U.S. PATENT DOCUMENTS

2022/0215879 A1* 7/2022 Hirano ............... G11C 13/0028
2022/0415425 A1* 12/2022 Rao .......................... G11C 29/42

* cited by examiner

*Primary Examiner* — Xiaochun L Chen
(74) *Attorney, Agent, or Firm* — Alliance IP, LLC

(57) ABSTRACT

In one embodiment, a state is reach from a memory cell comprising a phase change material (PM) region and a select device (SD) region by: ramping a voltage applied to a first address line of an address line pair corresponding to the memory cell until the first address line voltage is stabilized at a predetermined voltage, ramping a voltage applied to a second address line of the address line pair corresponding to the memory cell, detecting a snap in the memory cell while ramping the voltage applied to the second address line, and determining a state of the memory cell based on a differential voltage between the first and second address lines when the memory cell snap occurred.

25 Claims, 10 Drawing Sheets

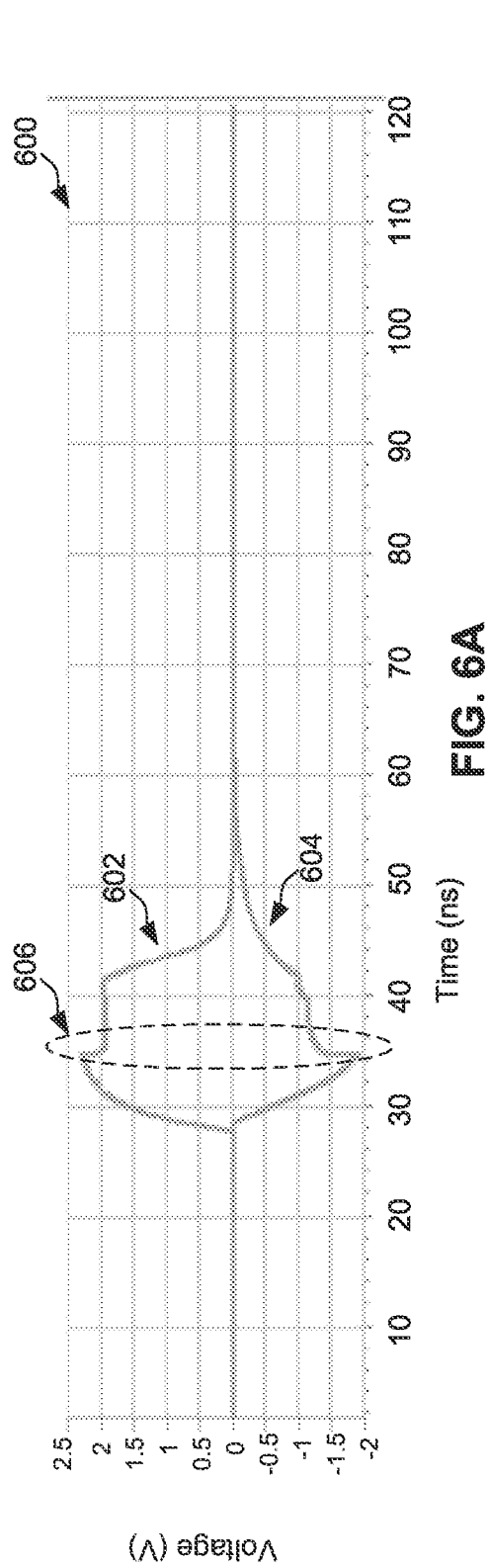
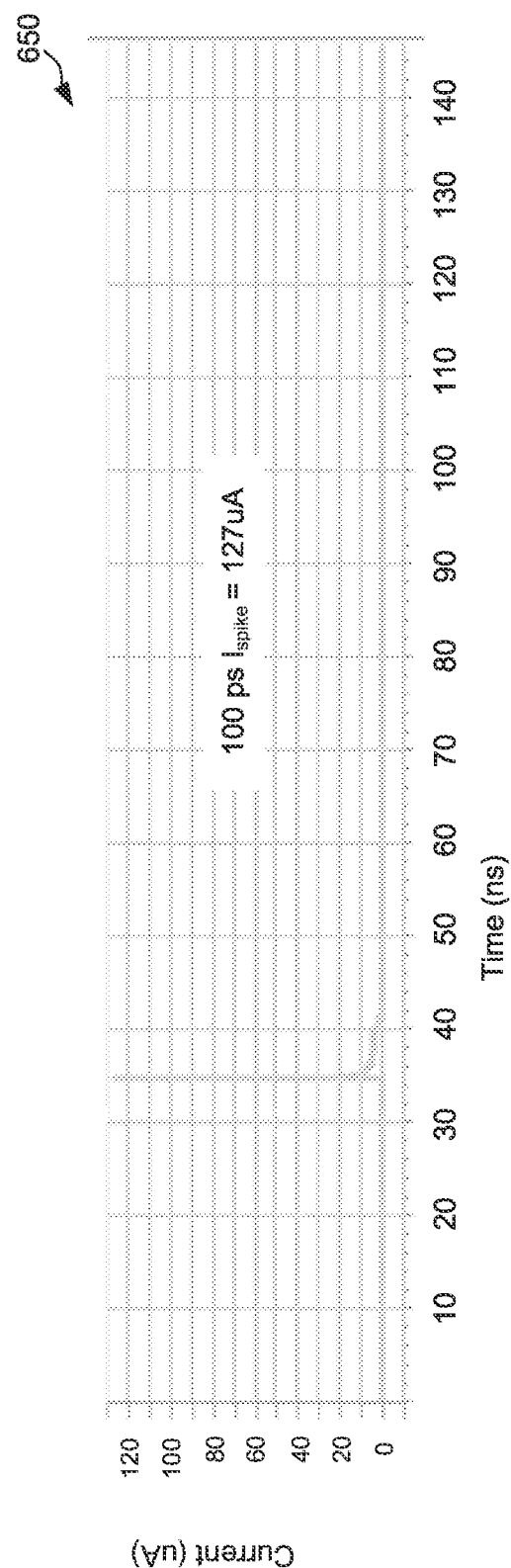

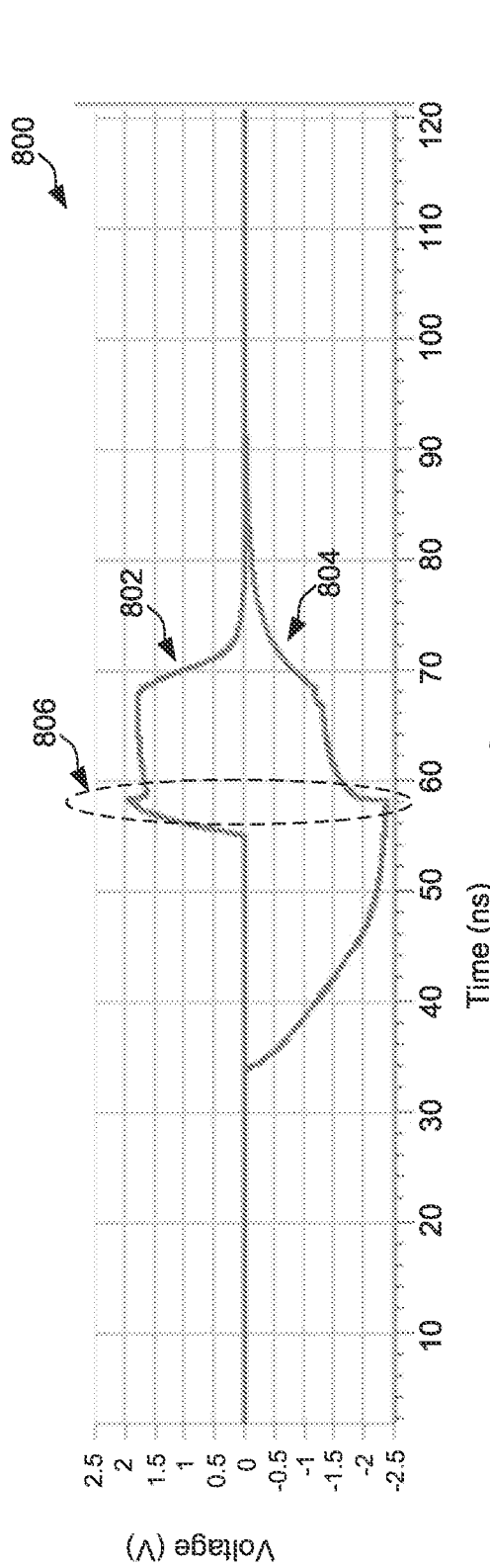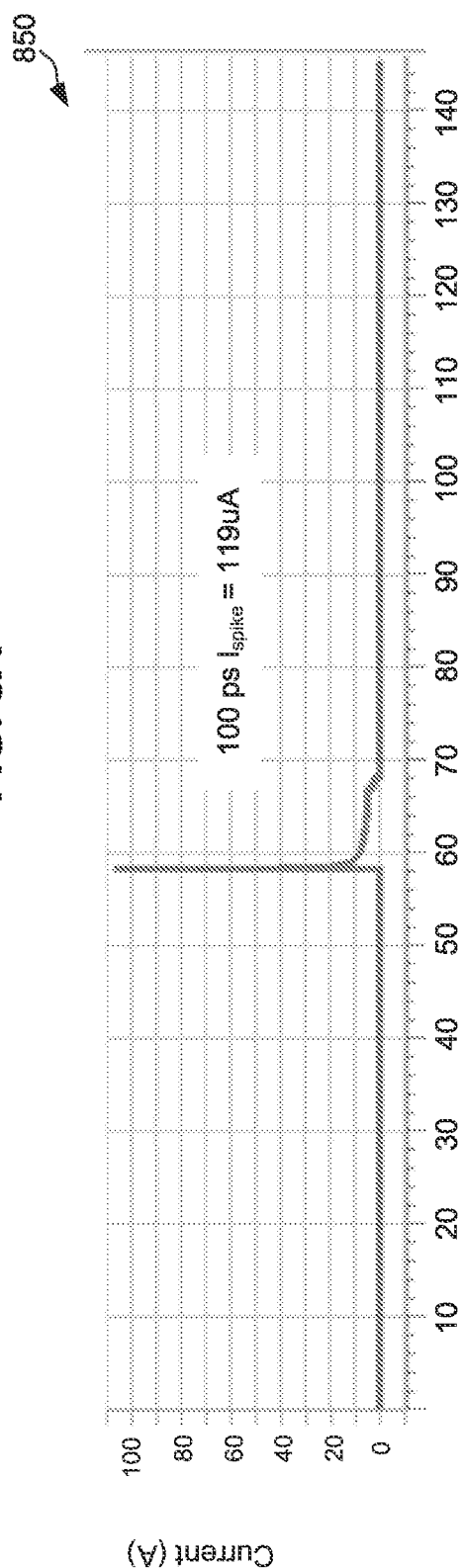

READ ALGORITHMS FOR THREE-DIMENSIONAL CROSSPOINT MEMORY ARCHITECTURES

FIELD

The present disclosure relates in general to the field of computer development, and more specifically, to read algorithms for three-dimensional crosspoint memory architectures.

BACKGROUND

A storage device may include multi-stack 3D crosspoint memory cells or arrays, and such memory cells may encode different states based on the state of a phase change material in the memory cell. Mechanisms for reading the state of these cells, which cause a spike in current through the cell, can disturb the state of the phase change material and cause degradation in the state of the memory cell as more reads are performed.

BRIEF DESCRIPTION OF THE DRAWINGS

FIGS. 6A-6B illustrate example simulation results of bitline and wordline voltages and memory cell current in a simultaneous ramp read algorithm for three-dimensional crosspoint memory architectures.

FIGS. 8A-8B illustrate example simulation results of bitline and wordline voltages and memory cell current in another example read algorithm for three-dimensional crosspoint memory architectures in accordance with embodiments of the present disclosure.

Like reference numbers and designations in the various drawings indicate like elements.

DETAILED DESCRIPTION

Although the drawings depict particular computer systems, the concepts of various embodiments are applicable to any suitable computer systems. Examples of systems in which teachings of the present disclosure may be used include desktop computer systems, server computer systems, storage systems, handheld devices, tablets, other thin notebooks, system on a chip (SOC) devices, and embedded applications. Some examples of handheld devices include cellular phones, digital cameras, media players, personal digital assistants (PDAs), and handheld PCs. Embedded applications may include microcontrollers, digital signal processors (DSPs), SOCs, network computers (NetPCs), set-top boxes, network hubs, wide area networks (WANs) switches, or any other system that can perform the functions and operations taught below. Various embodiments of the present disclosure may be used in any suitable computing environment, such as a personal computing device, a server, a mainframe, a cloud computing service provider infrastructure, a datacenter, a communications service provider infrastructure (e.g., one or more portions of an Evolved Packet Core), or other environment comprising one or more computing devices.

Figure 1:
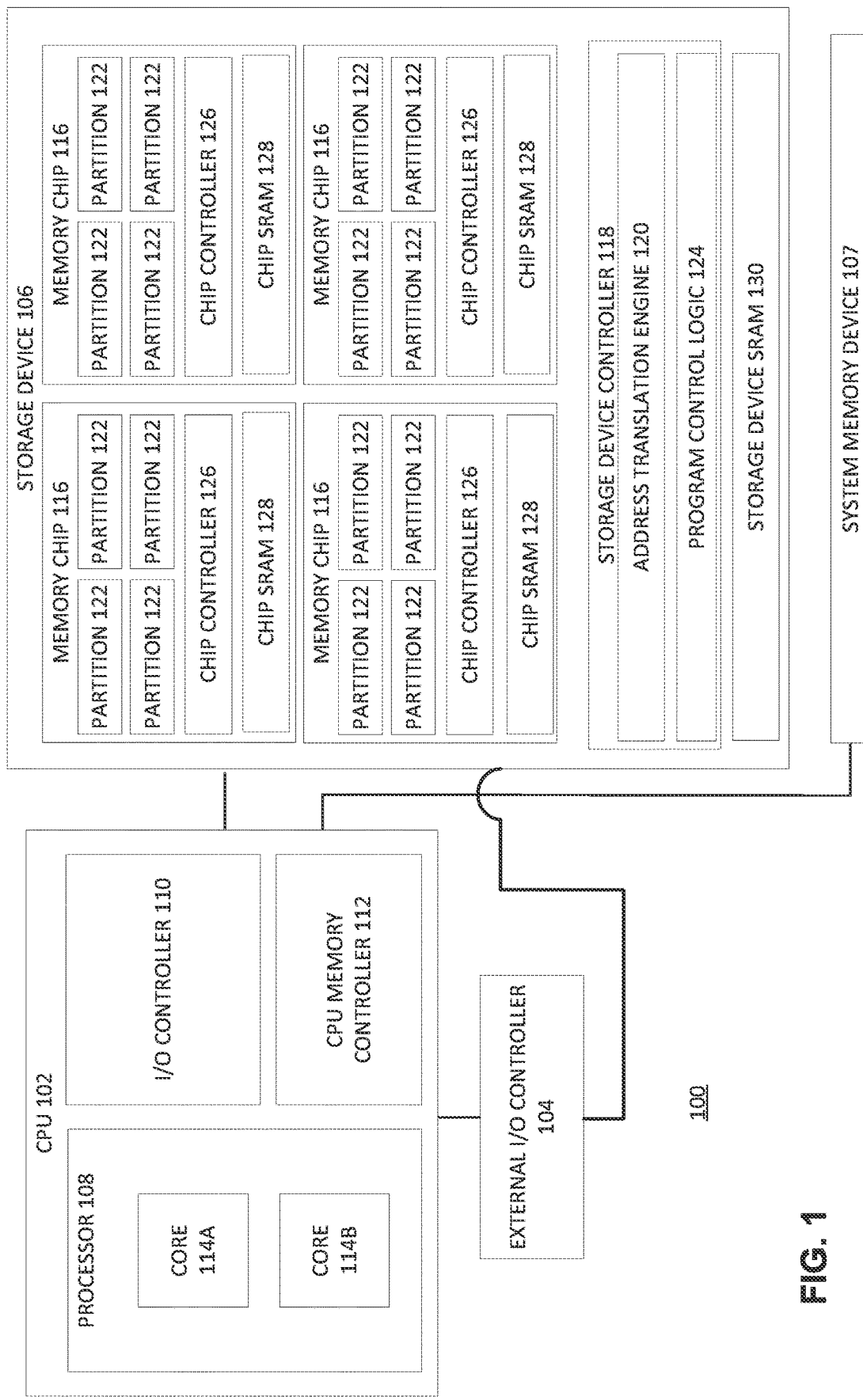
FIG. 1 is a schematic illustration of a block diagram of components of a computer system according to some embodiments.

FIG. 1 illustrates a block diagram of components of a computer system 100 in accordance with some embodiments. System 100 includes a central processing unit (CPU) 102 coupled to an external input/output (I/O) controller 104, a storage device 106 such as a solid state drive (SSD), and system memory device 107. During operation, data may be transferred between a storage device 106 and/or system memory device 107 and the CPU 102. In various embodiments, particular memory access operations (e.g., read and write operations) involving a storage device 106 or system memory device 107 may be issued by an operating system and/or other software applications executed by processor 108. In various embodiments, a storage device 106 may include a storage device controller 118 and one or more memory chips 116 that each comprise any suitable number of memory partitions 122.

In various embodiments, a memory partition 122 may include a 3D crosspoint memory array. In some embodiments, a 3D crosspoint memory array may comprise a transistor-less (e.g., at least with respect to the data storage elements of the memory) stackable crosspoint architecture in which memory cells sit at the intersection of row address lines and column address lines arranged in a grid.

During a read operation, a differential bias sometimes referred to as a demarcation voltage (VDM) may be applied across the terminals of the memory cell and the state of the memory cell may be sensed based on the reaction of the memory cell to the applied bias. For example, the memory cell may either go into a conductive ON state (logic one) or remain in a weakly conductive OFF state (logic zero). The applied voltage at which a memory cell transitions from being sensed as a logic one to being sensed as a logic zero may be termed a threshold voltage of the memory cell. Thus, as an example, when the VDM is higher than the threshold voltage of the memory cell, the memory cell may be sensed as storing a logic one and when the VDM is lower than the threshold voltage of the memory cell, the memory cell may be sensed as storing a logic zero.

CPU 102 comprises a processor 108, such as a microprocessor, an embedded processor, a digital signal processor (DSP), a network processor, a handheld processor, an application processor, a co-processor, an SOC, or other device to execute code (e.g., software instructions). Processor 108, in the depicted embodiment, includes two processing elements (cores 114A and 114B in the depicted embodiment), which may include asymmetric processing elements or symmetric processing elements. However, a processor may include any number of processing elements that may be symmetric or asymmetric. CPU 102 may be referred to herein as a host computing device (though a host computing device may be any suitable computing device operable to issue memory access commands to a storage device 106).

A processing element refers to hardware or logic to support a software thread. Examples of hardware processing elements include: a thread unit, a thread slot, a thread, a process unit, a context, a context unit, a logical processor, a hardware thread, a core, and/or any other element, which is capable of holding a state for a processor, such as an execution state or architectural state. In other words, a processing element, in one embodiment, refers to any hardware capable of being independently associated with code, such as a software thread, operating system, application, or other code. A physical processor (or processor socket) typically refers to an integrated circuit, which potentially includes any number of other processing elements, such as cores or hardware threads.

A core 114 (e.g., 114A or 114B) may refer to logic located on an integrated circuit capable of maintaining an independent architectural state, wherein each independently maintained architectural state is associated with at least some dedicated execution resources. A hardware thread may refer to any logic located on an integrated circuit capable of maintaining an independent architectural state, wherein the independently maintained architectural states share access to execution resources. As can be seen, when certain resources are shared and others are dedicated to an architectural state, the line between the nomenclature of a hardware thread and core overlaps. Yet often, a core and a hardware thread are viewed by an operating system as individual logical processors, where the operating system is able to individually schedule operations on each logical processor.

The processing elements may also include one or more arithmetic logic units (ALUs), floating point units (FPUs), caches, instruction pipelines, interrupt handling hardware, registers, or other hardware to facilitate the operations of the processing elements.

I/O controller 110 is an integrated I/O controller that includes logic for communicating data between CPU 102 and I/O devices, which may refer to any suitable logic capable of transferring data to and/or receiving data from an electronic system, such as CPU 102. For example, an I/O device may comprise an audio/video (A/V) device controller such as a graphics accelerator or audio controller; a data storage device controller, such as a flash memory device, magnetic storage disk, or optical storage disk controller; a wireless transceiver; a network processor; a network interface controller; or a controller for another input device such as a monitor, printer, mouse, keyboard, or scanner; or other suitable device. In a particular embodiment, an I/O device may comprise storage device controller 118 of storage device 106 coupled to the CPU 102 through I/O controller 110. I/O circuitry (not shown) of the storage device controller 118 may be used for communication of data and signals between the CPU and the storage device controller 118 of storage device 106.

An I/O device may communicate with the I/O controller 110 of the CPU 102 using any suitable signaling protocol, such as peripheral component interconnect (PCI), PCI Express (PCIe), Universal Serial Bus (USB), Serial Attached SCSI (SAS), Serial ATA (SATA), Fibre Channel (FC), IEEE 802.3, IEEE 802.11, or other current or future signaling protocol. In particular embodiments, I/O controller 110 and an associated I/O device may communicate data and commands in accordance with a logical device interface specification such as Non-Volatile Memory Express (NVMe) (e.g., as described by one or more of the specifications available at www.nvmexpress.org/specifications/) or Advanced Host Controller Interface (AHCI) (e.g., as described by one or more AHCI specifications such as Serial ATA AHCI: Specification, Rev. 1.3.1 available at http://www.intel.com/content/www/us/en/io/serial-ata/serial-ata-ahci-spec-rev1-3-1.html). In various embodiments, I/O devices coupled to the I/O controller 110 may be located off-chip (e.g., not on the same chip as CPU 102) or may be integrated on the same chip as the CPU 102.

CPU memory controller 112 is an integrated memory controller that controls the flow of data going to and from one or more system memory devices 107. CPU memory controller 112 may include logic operable to read from a system memory device 107, write to a system memory device 107, or to request other operations from a system memory device 107. In various embodiments, CPU memory controller 112 may receive write requests from cores 114 and/or I/O controller 110 and may provide data specified in these requests to a system memory device 107 for storage therein. CPU memory controller 112 may also read data from a system memory device 107 and provide the read data to I/O controller 110 or a core 114. During operation, CPU memory controller 112 may issue commands including one or more addresses of the system memory device 107 in order to read data from or write data to memory (or to perform other operations). In some embodiments, CPU memory controller 112 may be implemented on the same chip as CPU 102, whereas in other embodiments, CPU memory controller 112 may be implemented on a different chip than that of CPU 102. I/O controller 110 may perform similar operations with respect to one or more storage devices 106.

The CPU 102 may also be coupled to one or more other I/O devices through external I/O controller 104. In a particular embodiment, external I/O controller 104 may couple a storage device 106 to the CPU 102. External I/O controller 104 may include logic to manage the flow of data between one or more CPUs 102 and I/O devices. In particular embodiments, external I/O controller 104 is located on a motherboard along with the CPU 102. The external I/O controller 104 may exchange information with components of CPU 102 using point-to-point or other interfaces. According to an alternative embodiment, the external I/O controller 104 may be used to couple of the CPU 102 to I/O devices other than the storage device 106, and the storage device 106 may be directly coupled to the CPU 102.

In the instant disclosure, I/O controller 110, CPU memory controller 112, external I/O controller 104 may each be referred to, from the standpoint of the storage device 106, as an "external controller."

A system memory device 107 may store any suitable data, such as data used by processor 108 to provide the functionality of computer system 100. For example, data associated with programs that are executed or files accessed by cores 114 may be stored in system memory device 107. Thus, a system memory device 107 may include a system memory that stores data and/or sequences of instructions that are executed or otherwise used by the cores 114. In various embodiments, a system memory device 107 may store temporary data, persistent data (e.g., a user's files or instruction sequences) that maintains its state even after power to the system memory device 107 is removed, or a combination thereof. A system memory device 107 may be dedicated to a particular CPU 102 or shared with other devices (e.g., one or more other processors or other devices) of computer system 100.

In various embodiments, a system memory device 107 may include a memory comprising any number of memory partitions, a memory device controller, and other supporting logic (not shown). A memory partition may include non-volatile memory and/or volatile memory.

Non-volatile memory is a storage medium that does not require power to maintain the state of data stored by the medium, thus non-volatile memory may have a determinate state even if power is interrupted to the device housing the memory. In various embodiments, non-volatile memory may be byte or block addressable. Nonlimiting examples of nonvolatile memory may include any or a combination of: solid state memory (such as planar or 3-dimensional (3D) NAND flash memory or NOR flash memory), 3D crosspoint memory, phase change memory or SXP memory (e.g., memory that uses a chalcogenide glass phase change material in the memory cells), ferroelectric memory, silicon-oxide-nitride-oxide-silicon (SONOS) memory, polymer memory (e.g., ferroelectric polymer memory), ferroelectric transistor random access memory (Fe-TRAM) ovonic memory, anti-ferroelectric memory, nanowire memory, electrically erasable programmable read-only memory (EEPROM), a memristor, single or multi-level phase change memory (PCM), Spin Hall Effect Magnetic RAM (SHE-MRAM), and Spin Transfer Torque Magnetic RAM (STTRAM), a resistive memory, magnetoresistive random access memory (MRAM) memory that incorporates memristor technology, resistive memory including the metal oxide base, the oxygen vacancy base and the conductive bridge Random Access Memory (CB-RAM), a spintronic magnetic junction memory based device, a magnetic tunneling junction (MTJ) based device, a DW (Domain Wall) and SOT (Spin Orbit Transfer) based device, a thiristor based memory device, or a combination of any of the above, or other memory.

Volatile memory is a storage medium that requires power to maintain the state of data stored by the medium (thus volatile memory is memory whose state (and therefore the data stored on it) is indeterminate if power is interrupted to the device housing the memory). Dynamic volatile memory requires refreshing the data stored in the device to maintain state. One example of dynamic volatile memory includes DRAM (dynamic random access memory), or some variant such as synchronous DRAM (SDRAM). A memory subsystem as described herein may be compatible with a number of memory technologies, such as DDR3 (double data rate version 3, original release by JEDEC (Joint Electronic Device Engineering Council) on Jun. 27, 2007, currently on release 21), DDR4 (DDR version 4, JESD79-4 initial specification published in September 2012 by JEDEC), DDR4E (DDR version 4, extended, currently in discussion by JEDEC), LPDDR3 (low power DDR version 3, JESD209-3B, August 2013 by JEDEC), LPDDR4 (LOW POWER DOUBLE DATA RATE (LPDDR) version 4, JESD209-4, originally published by JEDEC in August 2014), WIO2 (Wide I/O 2 (WideIO2), JESD229-2, originally published by JEDEC in August 2014), HBM (HIGH BANDWIDTH MEMORY DRAM, JESD235, originally published by JEDEC in October 2013), DDR5 (DDR version 5, currently in discussion by JEDEC), LPDDR5, originally published by JEDEC in January 2020, HBM2 (HBM version 2), originally published by JEDEC in January 2020, or others or combinations of memory technologies, and technologies based on derivatives or extensions of such specifications.

A storage device 106 may store any suitable data, such as data used by processor 108 to provide functionality of computer system 100. For example, data associated with programs that are executed or files accessed by cores 114A and 114B may be stored in storage device 106. A storage device 106 may store data and/or sequences of instructions that are executed or otherwise used by the cores 114A and 114B. In various embodiments, a storage device 106 may store persistent data (e.g., a user's files or software application code) that maintains its state even after power to the storage device 106 is removed. A storage device 106 may be dedicated to CPU 102 or shared with other devices (e.g., another CPU or other device) of computer system 100.

In the embodiment depicted, storage device 106 includes a storage device controller 118 and four memory chips 116 each comprising four memory partitions 122 operable to store data, however, a storage device may include any suitable number of memory chips each having any suitable number of memory partitions. A memory partition 122 includes a plurality of memory cells operable to store data. The cells of a memory partition 122 may be arranged in any suitable fashion, such as in rows (e.g., wordlines) and columns (e.g., bitlines), three-dimensional structures, sectors, or in other ways. In various embodiments, the cells may be logically grouped into banks, blocks, subblocks, wordlines, pages, frames, bytes, slices, or other suitable groups. In various embodiments, a memory partition 122 may include any of the volatile or non-volatile memories listed above or other suitable memory. In a particular embodiment, each memory partition 122 comprises one or more 3D crosspoint memory arrays. 3D crosspoint arrays are described in more detail in connection with the following figures.

In various embodiments, storage device 106 may comprise a solid state drive; a memory card; a Universal Serial Bus (USB) drive; a Non-Volatile Dual In-line Memory Module (NVDIMM); storage integrated within a device such as a smartphone, camera, or media player; or other suitable mass storage device.

In a particular embodiment, one or more memory chips 116 are embodied in a semiconductor package. In various embodiments, a semiconductor package may comprise a casing comprising one or more semiconductor chips (also referred to as dies). A package may also comprise contact pins or leads used to connect to external circuits. In various embodiments, a memory chip may include one or more memory partitions 122.

Accordingly, in some embodiments, storage device 106 may comprise a package that includes a plurality of chips that each include one or more memory partitions 122. However, a storage device 106 may include any suitable arrangement of one or more memory partitions and associated logic in any suitable physical arrangement. For example, memory partitions 122 may be embodied in one or more different physical mediums, such as a circuit board, semiconductor package, semiconductor chip, disk drive, other medium, or any combination thereof.

System memory device 107 and storage device 106 may comprise any suitable types of memory and are not limited to a particular speed, technology, or form factor of memory in various embodiments. For example, a storage device 106 may be a disk drive (such as a solid-state drive), a flash drive, memory integrated with a computing device (e.g., memory integrated on a circuit board of the computing device), a memory module (e.g., a dual in-line memory module) that may be inserted in a memory socket, or other type of storage device. Similarly, system memory 107 may have any suitable form factor. Moreover, computer system 100 may include multiple different types of storage devices.

System memory device 107 or storage device 106 may include any suitable interface to communicate with CPU memory controller 112 or I/O controller 110 using any suitable communication protocol such as a DDR-based protocol, PCI, PCIe, USB, SAS, SATA, FC, System Management Bus (SMBus), or other suitable protocol. A system memory device 107 or storage device 106 may also include a communication interface to communicate with CPU memory controller 112 or I/O controller 110 in accordance with any suitable logical device interface specification such as NVMe, AHCI, or other suitable specification. In particular embodiments, system memory device 107 or storage device 106 may comprise multiple communication interfaces that each communicate using a separate protocol with CPU memory controller 112 and/or I/O controller 110.

Storage device controller 118 may include logic to receive requests from CPU 102 (e.g., via an interface that communicates with CPU memory controller 112 or I/O controller 110), cause the requests to be carried out with respect to the memory chips 116, and provide data associated with the requests to CPU 102 (e.g., via CPU memory controller 112 or I/O controller 110). Storage device controller 118 may also be operable to detect and/or correct errors encountered during memory operations via an error correction code (ECC engine). In an embodiment, controller 118 also tracks, e.g., via a wear leveling engine, the number of times particular cells (or logical groupings of cells) have been written to in order to perform wear leveling, detect when cells are nearing an estimated number of times they may be reliably written to, and/or adjust read operations based on the number of times cells have been written to. In performing wear leveling, the storage device controller 118 may evenly spread out write operations among the cells of memory chips 116 in an attempt to equalize the number of operations (e.g., write operations) performed by each cell. In various embodiments, controller 118 may also monitor various characteristics of the storage device 106 such as the temperature or voltage and report associated statistics to the CPU 102. Storage device controller 118 can be implemented on the same circuit board or device as the memory chips 116 or on a different circuit board or device. For example, in some environments, storage device controller 118 may be a centralized storage controller that manages memory operations for multiple different storage devices 106 of computer system 100.

In various embodiments, the storage device 106 also includes program control logic 124 which is operable to control the programming sequence performed when data is written to or read from a memory chip 116. In various embodiments, program control logic 124 may provide the various voltages (or information indicating which voltages should be provided) that are applied to memory cells during the programming and/or reading of data (or perform other operations associated with read or program operations), perform error correction, and perform other suitable functions.

In various embodiments, the program control logic 124 may be integrated on the same chip as the storage device controller 118 or on a different chip. In the depicted embodiment, the program control logic 124 is shown as part of the storage device controller 118, although in various embodiments, all or a portion of the program control logic 124 may be separate from the storage device controller 118 and communicably coupled to the storage device controller 118. For example, all or a portion of the program control logic 124 described herein may be located on a memory chip 116. In various embodiments, reference herein to a "controller" may refer to any suitable control logic, such as storage device controller 118, chip controller 126, or a partition controller. In some embodiments, reference to a controller may contemplate logic distributed on multiple components, such as logic of a storage device controller 118, chip controller 126, and/or a partition controller.

In various embodiments, storage device controller 118 may receive a command from a host device (e.g., CPU 102), determine a target memory chip for the command, and communicate the command to a chip controller 126 of the target memory chip. In some embodiments, the storage device controller 118 may modify the command before sending the command to the chip controller 126.

In various embodiments, the storage device controller 118 may send commands to memory chips 116 to perform host-initiated read operations as well as device-initiated read operations. A host-initiated read operation may be performed in response to reception of a read command from a host coupled to the storage device 106, such as CPU 102. A device-initiated read operation may be a read operation that is performed in response to a device-initiated read command generated by the storage device 106 independent of receiving a read command from the host. In various embodiments, the storage device controller 118 may be the component that generates device-initiated read commands. The storage device 106 may initiate a device-initiated read command for any suitable reason. For example, upon power up of a storage device, the storage device 106 may initiate a plurality of read and write-back commands to re-initialize data of the storage device 106 (e.g., to account for any drift that has occurred while the storage device 106 or a portion thereof was powered off or has sat idle for a long period of time).

The chip controller 126 may receive a command from the storage device controller 118 and determine a target memory partition 122 for the command. The chip controller 126 may then send the command to a controller of the determined memory partition 122. In various embodiments, the chip controller 126 may modify the command before sending the command to the controller of the partition 122.

In some embodiments, all or some of the elements of system 100 are resident on (or coupled to) the same circuit board (e.g., a motherboard). In various embodiments, any suitable partitioning between the elements may exist. For example, the elements depicted in CPU 102 may be located on a single die (e.g., on-chip) or package or any of the elements of CPU 102 may be located off-chip or off-package. Similarly, the elements depicted in storage device 106 may be located on a single chip or on multiple chips. In various embodiments, a storage device 106 and a computing host (e.g., CPU 102) may be located on the same circuit board or on the same device and in other embodiments the storage device 106 and the computing host may be located on different circuit boards or devices.

The components of system 100 may be coupled together in any suitable manner. For example, a bus may couple any of the components together. A bus may include any known interconnect, such as a multi-drop bus, a mesh interconnect, a ring interconnect, a point-to-point interconnect, a serial interconnect, a parallel bus, a coherent (e.g. cache coherent) bus, a layered protocol architecture, a differential bus, and a Gunning transceiver logic (GTL) bus. In various embodiments, an integrated I/O subsystem includes point-to-point multiplexing logic between various components of system 100, such as cores 114, one or more CPU memory controllers 112, I/O controller 110, integrated I/O devices, direct memory access (DMA) logic (not shown), etc. In various embodiments, components of computer system 100 may be coupled together through one or more networks comprising any number of intervening network nodes, such as routers, switches, or other computing devices. For example, a computing host (e.g., CPU 102) and the storage device 106 may be communicably coupled through a network.

Although not depicted, system 100 may use a battery and/or power supply outlet connector and associated system to receive power, a display to output data provided by CPU 102, or a network interface allowing the CPU 102 to communicate over a network. In various embodiments, the battery, power supply outlet connector, display, and/or network interface may be communicatively coupled to CPU 102. Other sources of power can be used such as renewable energy (e.g., solar power or motion based power).

Storage device SRAM/DRAM 130 and chip SRAM/DRAM 128 each are adapted to execute internal firmware or software of the storage device 106 and memory chip 116, respectively. For example, the logic to be implemented by program control logic 124, upon the issuance of a command, for example from the host or CPU 102 to execute the logic, may be moved from a memory storing the logic to SRAM/DRAM 130 such that the logic may be executed by the storage device controller 118 which will have access to the logic instructions by way of the associated SRAM/DRAM 128. Similarly, the logic to be implemented by the chip controller 126, upon the issuance of a command, for example from the host or CPU 102 to execute the logic, may be moved from a memory storage the logic to the associated SRAM/DRAM 128 (or another type of memory) such that the logic may be executed by the associated chip controller 126 which will have access to the logic instructions by way of the associated SRAM/DRAM 128.

Figure 2:
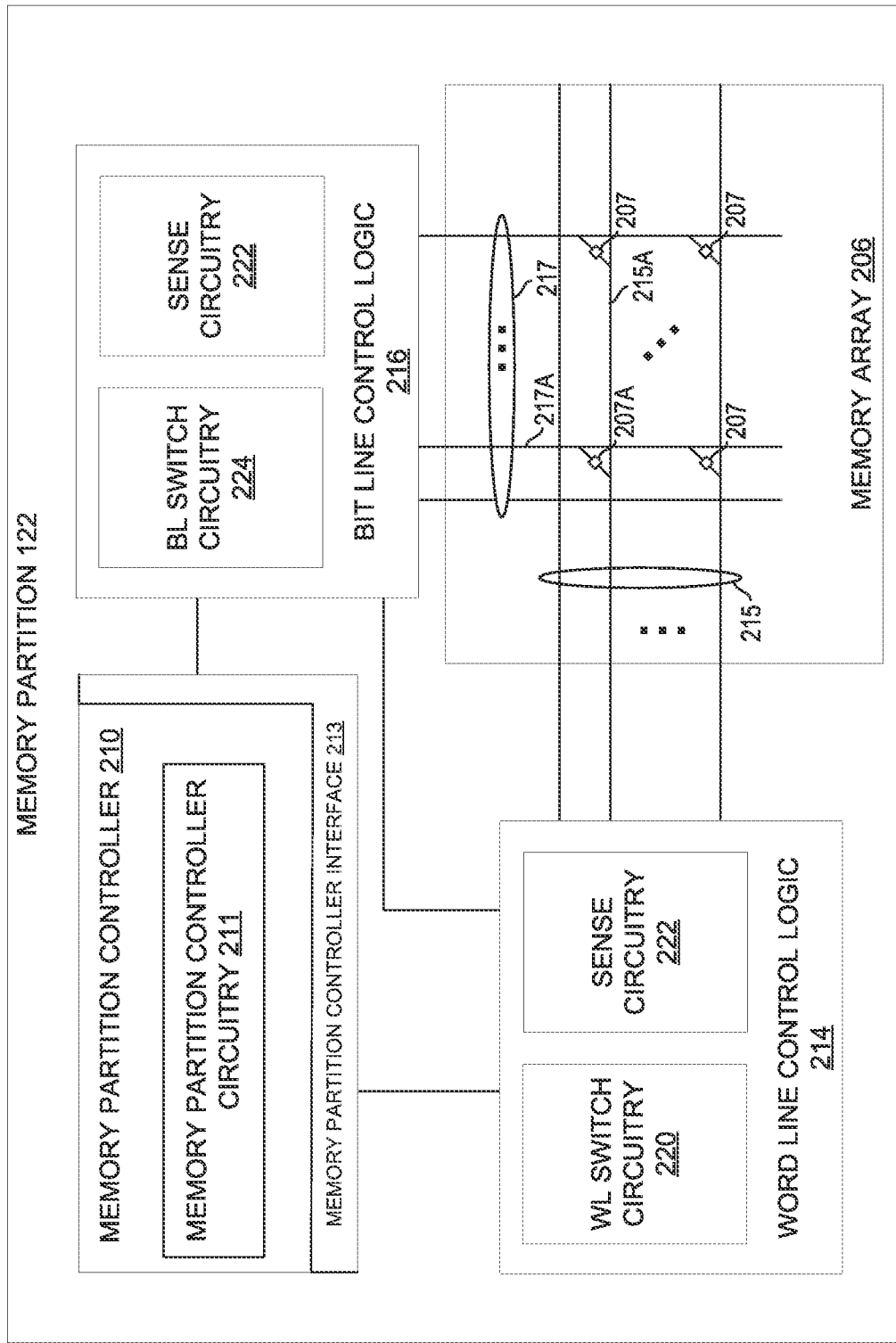
FIG. 2 is a schematic illustration of a memory partition in accordance with certain embodiments.

FIG. 2 illustrates a detailed exemplary view of the memory partition 122 of FIG. 1 in accordance with certain embodiments. In one embodiment, a memory partition 122 may include 3D crosspoint memory which may include phase change memory or other suitable memory types. In a particular embodiment, phase change memory may utilize a chalcogenide material for memory elements. A memory element is a unit of a memory cell that actually stores the information. In operation, phase change memory may store information on the memory element by changing the phase of the memory element between amorphous and crystalline phases. The memory element (e.g., that includes a phase change material such as a chalcogenide material) may be referred to as a "PM" portion of the memory cell. The material of a memory element (e.g., the chalcogenide material) may exhibit either a crystalline or an amorphous phase, exhibiting a low or high conductivity. Generally, the amorphous phase has a low conductivity (high impedance) and is associated with a reset state (logic zero) and the crystalline phase has a high conductivity (low impedance) and is associated with a set state (logic one). The memory element may be included in a memory cell 207 (e.g., a phase change memory cell) that also includes a selector, e.g., a select device (SD) coupled to the memory element. The SD regions of the memory cell 207 may be configured to facilitate combining a plurality of memory elements into an array. The SD region of the memory cell 207 may be made of, or include, a chalcogenide material. The SD region may be made of a different chalcogenide material than the PM region.

In some embodiments, a 3D crosspoint memory array 206 may comprise a transistor-less (e.g., at least with respect to the data storage elements of the memory) stackable crosspoint architecture in which memory cells 207 sit at the intersection of row address lines and column address lines arranged in a grid. The row address lines 215 and column address lines 217, called word lines (WLs) and bit lines (BLs), respectively, cross in the formation of the grid and each memory cell 207 is coupled between a WL and a BL where the WL and BL cross (e.g., at a crosspoint). At the point of a crossing, the WL and BL may be located at different vertical planes such that the WL crosses over the BL but does not physically touch the BL. As described above, the architecture may be stackable, such that a word line may cross over a bit line located beneath the word line and another bit line for another memory cell located above the word line. It should be noted that row and column are terms of convenience used to provide a qualitative description of the arrangement of WLs and BLs in crosspoint memory. In various embodiments, the cells of the 3D crosspoint memory array may be individually addressable. In some embodiments, bit storage may be based on a change in bulk resistance of a 3D crosspoint memory cell. In various embodiments, 3D crosspoint memory may include any of the characteristics of 3D)(Point memory manufactured by INTEL CORPORATION (Optane™ is the Intel Trademark for Intel's 3D crosspoint (3D Xpoint™) technology).

During a programming operation (e.g., a write operation), the phase of the memory element may be changed by the application of a first bias voltage to the WL and a second bias voltage to the BL resulting in a differential bias voltage across the memory cell that may cause a current to flow in the memory element. The differential bias voltage may be maintained across the memory cell for a time period sufficient to cause the memory element to "snap back" and to transition the memory element from the amorphous state to the crystalline state or from the crystalline state to the amorphous state (e.g., via the application of heat produced by an electric current). Snap back is a property of the composite memory element that results in an abrupt change in conductivity and an associated abrupt change in the voltage across the memory element.

In a read operation, a target memory cell is selected via the application of a first bias voltage to the selected WL and a second bias voltage to the selected BL that cross at the target memory cell for a time interval. A resulting differential bias voltage (a demarcation read voltage (VDM)) across the memory element is configured to be greater than a maximum set voltage and less than a minimum reset voltage for the memory element. Selection of the selected WL and selected BL and application of the first bias and second bias voltage may be implemented by a decoder in a switch circuitry, such as WL switch circuitry 220 and BL switch circuitry 240. In response to application of the VDM, the target memory element may or may not snap back, depending on whether the memory element is in the crystalline state (set) or the amorphous state (reset). Sense circuitry, coupled to the memory element, is configured to detect the presence or absence of snap back in a sensing time interval. The presence of snap back may then be interpreted as a logic one and the absence of snap back as a logic zero.

The differential bias at which a memory cell transitions from being sensed as a logic one (e.g., due to the memory cell snapping back) to being sensed as a logic zero (e.g., due to the memory cell not snapping back), may be termed a threshold voltage (sometimes referred to as a snap back voltage). Thus, when the VDM is higher than the threshold voltage of the memory cell, the memory cell may be sensed as storing a logic one and when the VDM is lower than the threshold voltage of the memory cell, the memory cell may be sensed as storing a logic zero.

In some embodiments, an applied bias such as the VDM of a read pulse may be high enough to only turn on 3D crosspoint cells in the crystalline state, which may have a lower threshold voltage than 3D crosspoint cells in the amorphous state. In some embodiments, the VDM may be supplied through negative and/or positive regulated nodes. For example, the bitline electrode of the 3D crosspoint cell may be a positive regulated node and the wordline electrode coupled to the cell may supply the bias for VDM.

For a write operation or a read operation, one memory cell 207A out of many cells, such as thousands of cells, may be selected as the target cell for the read or write operation, the cell being at the cross section of a BL 217A and a WL 215A. All cells coupled to BL 217A and all cells coupled to WL 215A other than cell 207A may still receive a portion of VDM (e.g., approximately ½ of VDM), with only cell 207A receiving the full VDM.

In the embodiment of FIG. 2, a memory partition 122 includes memory partition controller 210, word line control logic 214, bit line control logic 216, and memory array 206. A host device (e.g., CPU 102) may provide read and/or write commands including memory address(es) and/or associated data to memory partition 122 (e.g., via storage device controller 118 and chip controller 126) and may receive read data from memory partition 122 (e.g., via the chip controller 126 and storage device controller 118). Similarly, storage device controller 118 may provide host-initiated read and write commands or device-initiated read and write commands including memory addresses to memory partition 122 (e.g., via chip controller 126). Memory partition controller 210 (in conjunction with word line control logic 214 and bit line control logic 216) is configured to perform memory access operations, e.g., reading one or more target memory cells and/or writing to one or more target memory cells.

Memory array 206 corresponds to at least a portion of a 3D crosspoint memory (e.g., that may include phase change memory cells or other suitable memory cells) and includes a plurality of word lines 215, a plurality of bit lines 217 and a plurality of memory cells, e.g., memory cells 207. Each memory cell is coupled between a word line ("WL") and a bit line ("BL") at a crosspoint of the WL and the BL. Each memory cell includes a memory element configured to store information and may include a memory cell select device (e.g., selector) coupled to the memory element. Select devices may include ovonic threshold switches, diodes, bipolar junction transistors, field-effect transistors, etc. Memory array 206 may be configured to store binary data and may be written to (e.g., programmed) or read from.

Memory partition controller 210 may manage communications with chip controller 126 and/or storage device controller 118. In a particular embodiment, memory partition controller 210 may analyze one or more signals received from another controller to determine whether a command sent via a bus is to be consumed by the memory partition 122. For example, controller 210 may analyze an address of the command and/or a value on an enable signal line to determine whether the command applies to the memory partition 122. Controller 210 may be configured to identify one or more target WLs and/or BLs associated with a received memory address (this memory address may be a separate address from the memory partition address that identifies the memory partition 122, although in some embodiments a portion of an address field of a command may identify the memory partition while another portion of the address field may identify one or more WLs and/or BLs). Memory partition controller 210 may be configured to manage operations of WL control logic 214 and BL control logic 216 based, at least in part, on WL and/or BL identifiers included in a received command. Memory partition controller 210 may include memory partition controller circuitry 211, and a memory controller interface 213. Memory controller interface 213, although shown as a single block in FIG. 2, may include a plurality of interfaces, for example a separate interface for each of the WL control logic 214 and the BL control logic 216.

WL control logic 214 includes WL switch circuitry 220 and sense circuitry 222. WL control logic 214 is configured to receive target WL address(es) from memory partition controller 210 and to select one or more WLs for reading and/or writing operations. For example, WL control logic 214 may be configured to select a target WL by coupling a WL select bias voltage to the target WL. WL control logic 214 may be configured to deselect a WL by decoupling the target WL from the WL select bias voltage and/or by coupling a WL deselect bias voltage to the WL. WL control logic 214 may be coupled to a plurality of WLs 215 included in memory array 206. Each WL may be coupled to a number of memory cells corresponding to a number of BLs 217. WL switch circuitry 220 may include a plurality of switches, each switch configured to couple (or decouple) a respective WL, e.g., WL 215A, to a WL select bias voltage to select the respective WL 215A. For example, WL switch circuitry 220 may include a plurality of switches that each correspond to a particular WL. In one embodiment, each switch includes a pair of metal oxide semiconductor field effect transistors (MOSFETs) comprising a positive-type (p-type) metal oxide semiconductor transistor (PMOS) and a negative-type (n-type) MOS transistor (NMOS). The pair may form a complementary MOS circuit (CMOS).

BL control logic 216 includes BL switch circuitry 224. In some embodiments, BL control logic 216 may also include sense circuitry, e.g., sense circuitry 222. BL control logic 216 is configured to select one or more BLs for reading and/or writing operations. BL control logic 216 may be configured to select a target BL by coupling a BL select bias voltage to the target BL. BL control logic 216 may be configured to deselect a BL by decoupling the target BL from the BL select bias voltage and/or by coupling a BL deselect bias voltage to the BL. BL switch circuitry 224 is similar to WL switch circuitry 220 except BL switch circuitry 224 is configured to couple the BL select bias voltage to a target BL.

Sense circuitry 222 is configured to detect the state of one or more sensed memory cells 207 (e.g., via the presence or absence of a snap back event during a sense interval), e.g., during a read operation. Sense circuitry 222 is configured to provide a logic level output related to the result of the read operation to, e.g., memory partition controller 210. For example, a logic level corresponding to a logic one may be output if the applied VDM is higher than the memory cell's threshold voltage or a logic zero if the applied VDM is lower than the memory cell's threshold voltage. In a particular embodiment, a logic one may be output if a snap back is detected and a logic zero may be output if a snap back is not detected.

As an example, in response to a signal from memory partition controller 210, WL control logic 214 and BL control logic 216 may be configured to select a target memory cell, e.g., memory cell 207A, for a read operation by coupling WL 215A to WL select bias voltage and BL 217A to BL select bias voltage as well as coupling the other WLs and BLs to respective deselect bias voltages. One or both of sense circuitries 222 may then be configured to monitor WL 215A and/or BL 217A for a sensing interval in order to determine the state of the memory cell 207A (e.g., to determine whether or not a snap back event occurs). For example, if a sense circuitry 222 detects a snap back event, then memory cell 207A may be in the set state, but if a sense circuitry 222 does not detect a snap back event in the sensing interval, then memory cell 207A may be in the reset state.

Thus, WL control logic 214 and/or BL control logic 216 may be configured to select a target memory cell for a read operation, initiate the read operation, sense the selected memory cell (e.g., for a snap back event) in a sensing interval, and provide the result of the sensing to, e.g., memory partition controller 210.

In a particular embodiment, the sense circuitry 222 may include a WL load connected to a WL electrode or gate, and a BL load connected to a BL electrode or gate. When a particular wordline and bitline are selected in the array, a difference between WL load or WL voltage and the BL voltage corresponds to a read VDM. VDM may induce a current (icell) in the memory cell 207A. A comparator such as a sense amplifier may compare icell with a reference current in order to read a logic state one or logic state zero depending on whether the memory cell is a set cell or a reset cell. The reference current may thus be selected such that the current of the target memory cell is lower than the reference current before snapback of the target memory cell and higher than the reference current after snapback of the target memory cell. In this manner, an output of the sense amplifier/comparator may be indicative of a state of the target memory cell. A latch may be coupled to the output of the comparator to store the output of the read operation.

For each matrix of arrays, there may be a number of sense amplifiers provided, with the sense circuitry 222 able to process up to a maximum number of sensed bits, such as 128 bits, from the sense amplifiers at one time. Hence, 128 memory cells may be sensed at one time by sense amplifiers of the sense circuitry 222.

Figure 3:
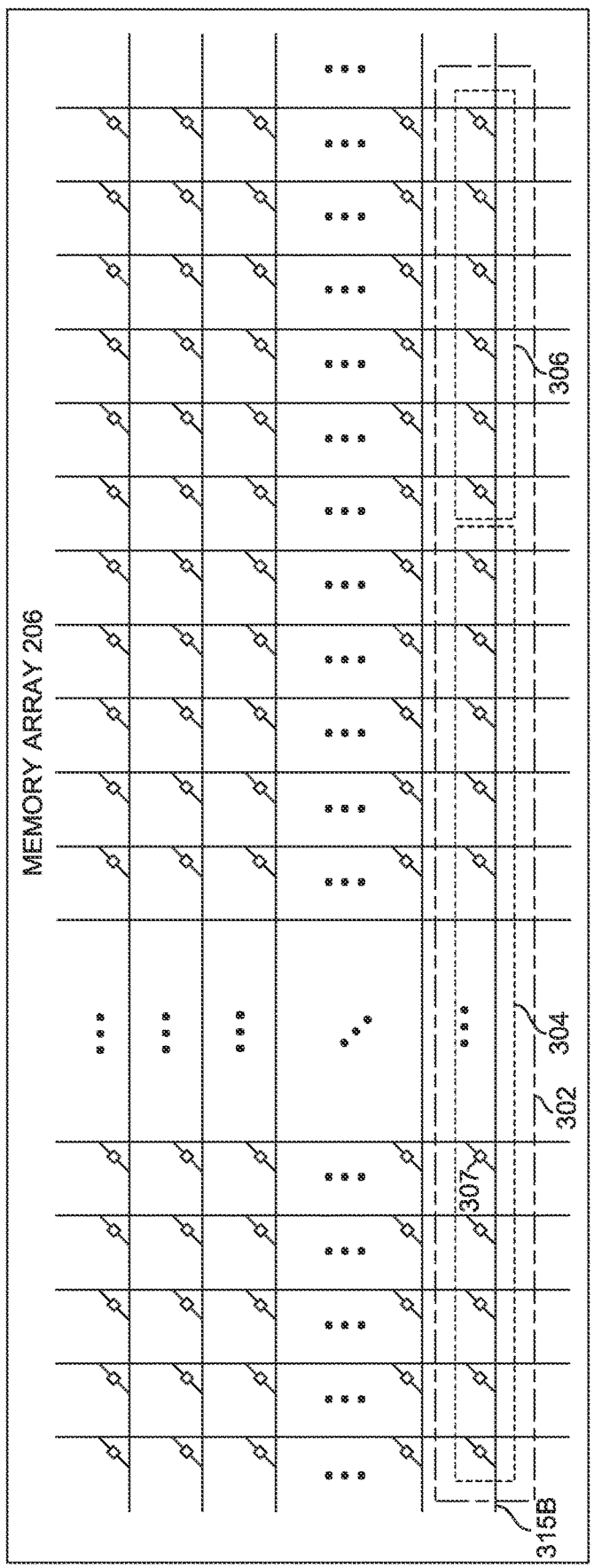
FIG. 3 is a schematic illustration of a memory array in accordance with certain embodiments.

FIG. 3 illustrates a detailed exemplary view of the memory array 206 of FIG. 2 in accordance with certain embodiments. In various embodiments, a plurality of memory cells 207 of memory array 206 may be divided into a logical group such as a slice 302 (and the memory array 206 may include a plurality of slices). In the embodiment depicted, slice 302 includes a plurality of memory cells 207 coupled to the same WL 215A, though a slice 302 may comprise any suitable arrangement of memory cells.

In a particular embodiment, a slice may include a payload portion 304 and a metadata portion 306. The memory cells of the payload portion 304 may store data written to the storage device 106 by a host (e.g., CPU 102/104). For example, the host may send a write command specifying payload data to be written to the storage device 106 at a particular logical address. The payload of the write command may be stored in a payload portion 304 of one or more slices 302 (in various embodiments, the payload portion 304 may be large enough to hold payload data from multiple write commands from the host). In various embodiments, the size of the payload portion of a slice may have any suitable size, such as 1 kibibyte (KiB), 2 KiB, 4 KiB, 8 KiB, or other suitable size.

The memory cells of the metadata portion 306 of a slice 302 may store metadata associated with the payload data stored in the payload portion 304 of the slice 302 or the slice itself. The metadata portion 306 may store any suitable metadata associated with the payload data or slice. For example, the metadata portion 306 may store parity bits and/or cyclic redundancy check (CRC) bits used during error detection and error correction, e.g., by the storage device controller 118. In alternative embodiments, error detection and/or correction may be performed at any suitable level on the storage device 106, such as by the chip controllers 126 or partition controllers.

Figure 4:
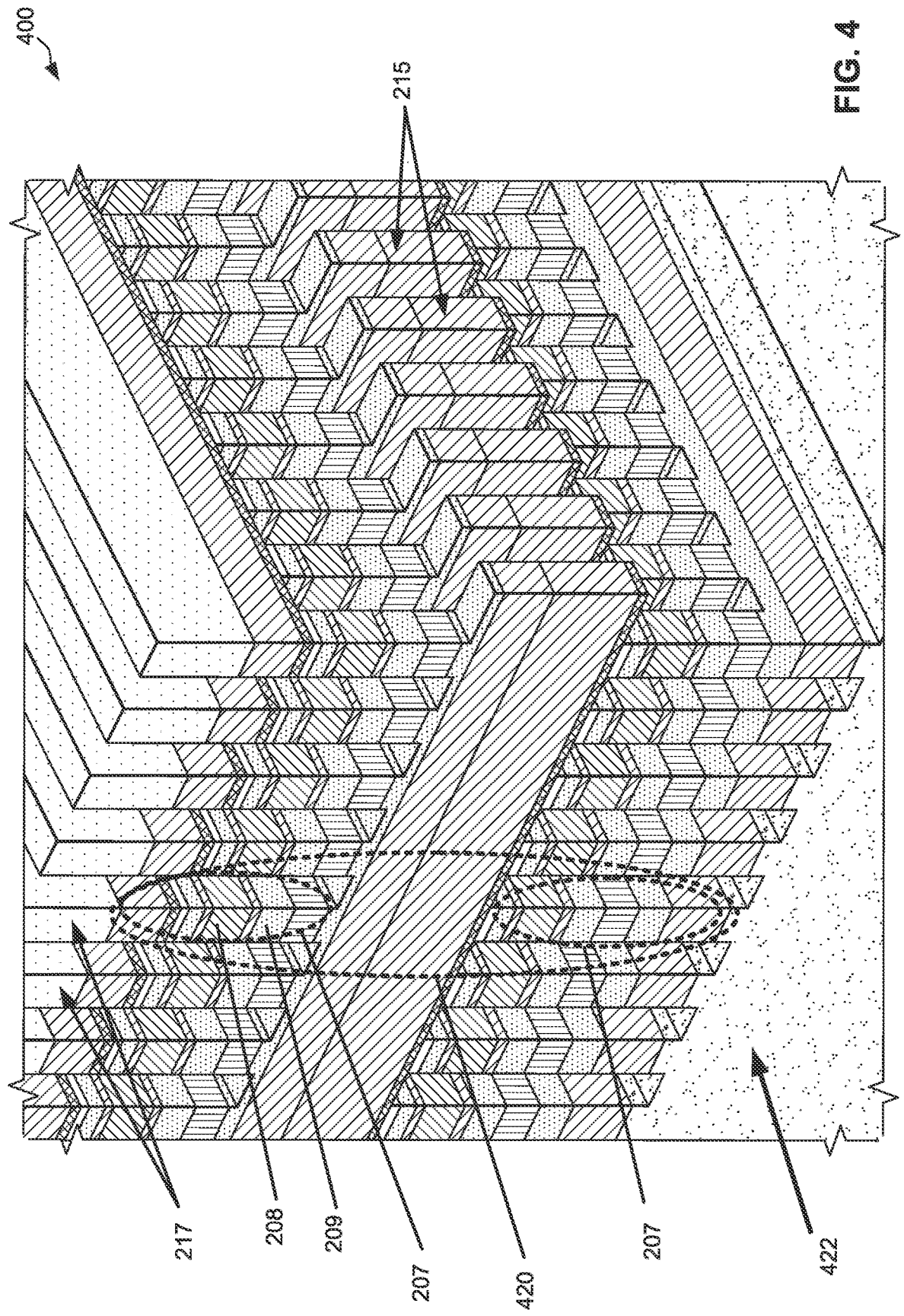
FIG. 4 is a schematic perspective three-dimensional view of a semiconductor structure for a 3D memory architecture according to some embodiments.

FIG. 4 is a perspective diagram of an example of a portion of stack 400 of a 3D crosspoint memory device including memory arrays such as those of FIGS. 2 and 3. The specific layers are merely examples, and will not be described in detail here. Stack 400 is built on substrate structure 422, such as silicon or other semiconductor. Stack 400 includes multiple pillars 420 as memory cell stacks of memory cells 207. In the diagram of stack 400, it will be observed that the WLs and BLs are orthogonal to each other, and traverse or cross each other in a cross-hatch pattern. A crosspoint memory structure includes at least one memory cell in a stack between layers of BL and WL. As illustrated, wordlines (WL) 215 are in between layers of elements, and bitlines (BL) 217 are located at the top of the circuit. Such a configuration is only an example, and the BL and WL structure can be swapped. Thus, in one representation of stack 400, the WLs can be the metal structures labeled as 217, and the BLs can be the metal structures labeled as 215. In one example, the BL and WL are made of tungsten metal. In some instances, WLs and BLs can be referred to as "address lines", referring to signal lines used to address memory cells. Different architectures can use different numbers of stacks of devices, and different configuration of WLs and BLs.

At least some of WLs 215 may correspond to WLs 215 of FIG. 2. At least some of the BLs 217 may correspond to BLs 217 of FIG. 2. Substrate structure 422, such as a silicon substrate, may include control circuitry therein (not shown), such as control circuitry including transistors, row decoders, page buffers, etc. Memory cells 207 may correspond to memory cells 207 of FIG. 2. The control circuitry of substrate structure 422 may include, for example, a memory partition controller such as memory partition controller 210, BL control logic such as BL control logic 216, and WL control logic such as WL control logic 214 of FIG. 2. Each row of WLs 215 extending in the Y direction, the corresponding cells as coupled to corresponding BLs, would define a memory array, and may correspond to a memory array such as memory array 206 of FIGS. 2 and 3. Some of the WLs and some of the BLs may include dummy WLs or dummy BLs (not shown in FIG. 4), corresponding to the dummy WLs and dummy BLs in the dummy array 206B of FIGS. 2 and 3.

Each memory cell 207 of the stack 400 includes a phase change material (PM) layer 208 and select device (SD) layer 209 in series between the WLs 215 and BLs 217. The PM layer 208 and SD layer 209 may be composed of chalcogenide materials as described above. Although shown in a particular order between the WLs 215 and BLs 217, the PM layer 208 and SD layer 209 of the memory cell 207 may be in a different order.

The memory cells 207 may be encoded into one of four states based on an application of bias voltages to the WLs and BLs, which cause a differential bias voltage across the memory cell thus, a current to flow in the memory cell to change the phase of the PM region of the cell.

Figure 5:
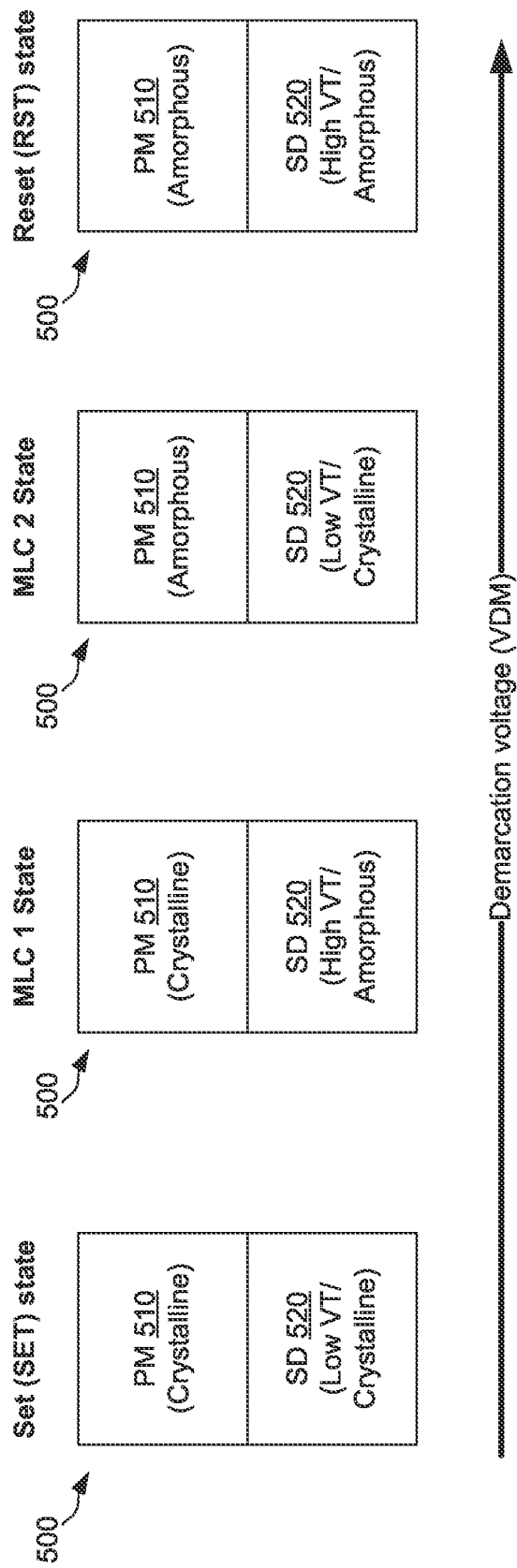
FIG. 5 illustrates example memory states of a memory cell in accordance with embodiments of the present disclosure.

FIG. 5 illustrates example memory states of a memory cell 500 in accordance with embodiments of the present disclosure. As shown, first state may be defined by a low VT state in the SD region 520 of the cell 500 and a crystalline state in the PM region 510 of the cell 500 (referred to herein as a SET state). A second state may be defined by a high VT state in the SD region 520 of the cell 500 and a crystalline state in the PM region 510 of the cell 500 (referred to herein as an MLC1 state). A third state may be defined by a low VT state in the SD region 520 of the cell 500 as in the first state, but with an amorphous state in the PM region 510 of the cell 500 (referred to herein as an MLC2 state). Finally, a fourth state may be defined by a high VT state in the SD region 520 of the cell 500 like the third state, but with and an amorphous state in the PM region 510 of the cell 500 (referred to herein as a RST state).

To achieve each of these states, certain currents may be applied to the memory cell in a particular amount and duration, which may be based on the properties of the PM and/or SD region materials, the size of the memory cell, or other factors. Examples processes for instantiating each of the four states are described in U.S. patent application Ser. No. 17/408,352, entitled "Encoding Additional States in a Three-Dimensional Crosspoint Memory Architecture", and filed Aug. 20, 2021.

In a read operation, the demarcation voltage (VDM) of the cell in the SET state may be the lowest of the four states, and the VDM of the cell in the RST state may be the highest of the four states. The VDM of the MLC1 and MLC2 states may be between these two states, with MLC1 being closer to the VDM of the SET state and the MLC2 being closer to the VDM of the RST state.

During such read operations, however, the selection mechanism may cause a spike in current through the cell, which can disturb the state of the PM region of the cell and cause degradation in the state of the memory cell as more reads are performed. This is particularly true for the first two states (e.g., the SET and MLC1 state) where the PM region 510 of the cell 500 is in the crystalline state, since the spike in current can cause portions of the PM region 510 to transform into the amorphous state, and accordingly limit the number of consecutive reads that can be performed on the cell before needing a refresh write. These current spikes are particularly problematic in cells that are close to the driver circuits as they receive the largest spike in current.

Accordingly, precise control of the selection spike current is needed to lower the disturbance to, and avoid damaging, the crystalline PM region in the SET and MLC1 states. Lowering the disturbance during the read process can lead to fewer error corrections that may be needed in reading the cells, leading to higher read bandwidth/speed and/or lower energy consumption.

Embodiments herein describe different read algorithms for memory states with crystalline PM regions (i.e., the SET and MLC1 states described herein). In each algorithm, one of the address lines of a cell (i.e., the WL or BL) is ramped to a particular voltage value, and once the address line is stabilized, the other address line (i.e., the BL or WL, respectively) is then ramped up. This is in contrast to current algorithms that may ramp both of the address lines at the same time. This simultaneous ramping causes a large gradient in the voltage applied across the cell (dV/dt), which in turn causes the large current spike through the cell when the cell "snaps" at the demarcation voltage. By ramping one address line at a time as described herein, the dV/dt may be lowered, causing a lower current spike through the cell, and accordingly, less disturbance in the crystalline PM region of the cell. By implementing the techniques described herein, the number of consecutive reads that a cell may incur before needing a refresh write be increased. In addition, the number of read errors for cells may be reduced, causing a lower latency overhead caused by error correction.

FIGS. 6A-6B illustrate example simulation results of bitline and wordline voltages 600 and memory cell current 650 in a simultaneous ramp read algorithm for three-dimensional crosspoint memory architectures. In particular, the examples shown in FIGS. 6A-6B correspond to a simultaneous ramping of the bitline voltage 602 and the wordline voltage 604. As shown, when the voltages are ramped simultaneously in this manner, the memory cell snaps (i.e., as shown at 606 by the sudden voltage drop) and there is a 100 ps current spike through the cell of 127 uA, which is large enough to damage the crystalline PM region, aggravating the decrystallization process of the PM region and creating a larger disturbance after reading the cell and lowering the capability of reads that can be done on the cell over time before making the PM region lose its crystalline state.

Figure 7A:
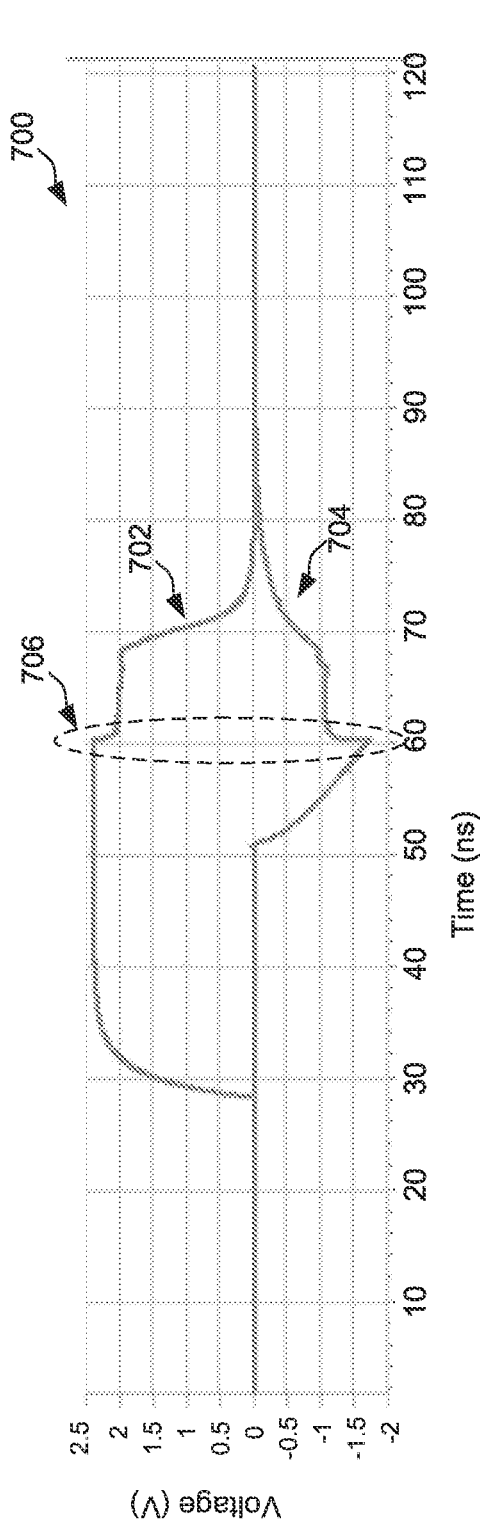
FIGS. 7A-7B illustrate example simulation results of bitline and wordline voltages and memory cell current in an example read algorithm for three-dimensional crosspoint memory architectures in accordance with embodiments of the present disclosure.
Figure 7B:
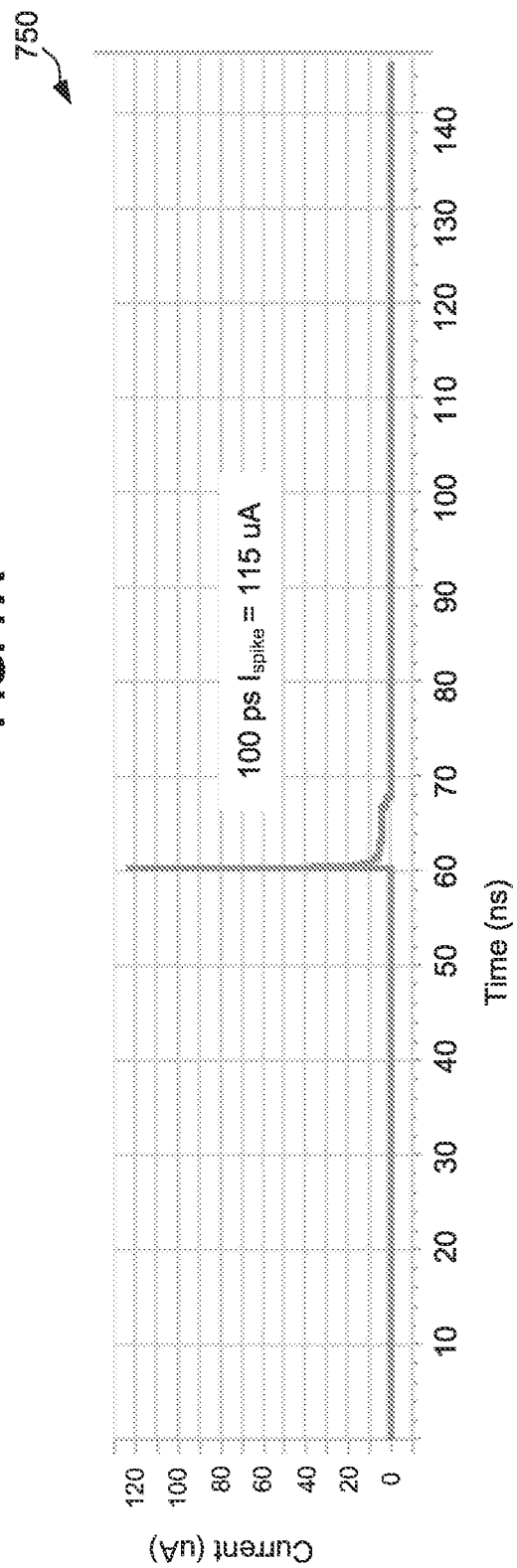

FIGS. 7A-7B illustrate example simulation results of bitline and wordline voltages 700 and memory cell current 750 in an example read algorithm for three-dimensional crosspoint memory architectures in accordance with embodiments of the present disclosure. In particular, the examples shown in FIGS. 7A-7B correspond to a bitline first ramping technique, where the bitline voltage 702 is ramped and stabilized (at ~2.4V) before ramping the wordline voltage 704. As in FIGS. 6A-6B, the memory cell snaps as shown at 706 by the sudden voltage drop, and there is a smaller 100 ps current spike through the cell of 115 uA as compared with the simultaneous ramping technique shown in FIGS. 6A-6B, leading to less damage to the crystalline PM region of the cell and enhancing the read disturb capability of the cell (i.e., its ability to withstand more read cycles).

FIGS. 8A-8B illustrate example simulation results of bitline and wordline voltages 800 and memory cell current 850 in another example read algorithm for three-dimensional crosspoint memory architectures in accordance with embodiments of the present disclosure. In particular, the examples shown in FIGS. 7A-7B correspond to a wordline first ramping technique, where the wordline voltage 804 is ramped and stabilized (at ~−2.4V) before ramping the bitline voltage 802. As with the previous examples, the memory cell snaps as shown at 806 by the sudden voltage drop, and there is a smaller 100 ps current spike through the cell of 119 uA as compared with the simultaneous ramping technique shown in FIGS. 6A-6B, leading again to less damage to the crystalline PM region of the cell and enhancing the read disturb capability of the cell (i.e., its ability to withstand more read cycles).

Figure 9:
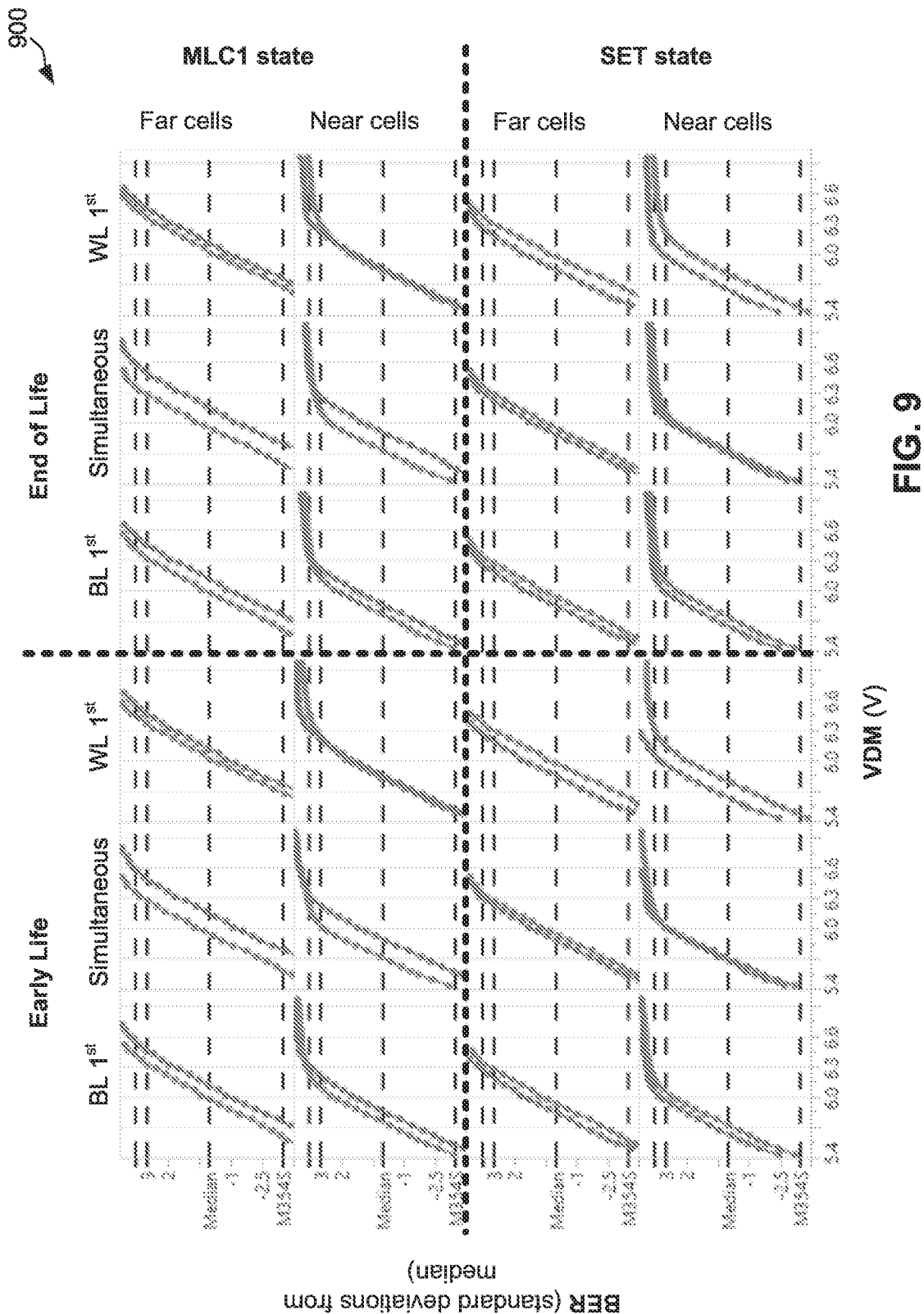
FIG. 9 illustrates example charts of distributions of bit error rates (BER) of memory cells against demarcation voltages (VDM) for the memory cells based on the different read algorithms described herein.

FIG. 9 illustrates example charts of distributions of bit error rates (BER) of memory cells against demarcation voltages (VDM) for the memory cells based on the different read algorithms described herein. In particular, the distributions are plotted for a bitline first ramp algorithm (i.e., where the bitline voltage is ramped and stabilized first and then the wordline voltage is ramped, e.g., as shown in FIG. 7), a simultaneous ramping of the bitline and wordline voltages (e.g., as shown in FIG. 6), and a wordline first ramp algorithm (i.e., where the wordline voltage is ramped and stabilized first and then the bitline voltage is ramped, e.g., as shown in FIG. 8). Each quadrant represents a stage of life for a memory cell and a particular state of the memory cell that is read using these algorithms. For instance, the upper left quadrant includes charts for early life memory cells encoded with the MLC1 state, the upper right quadrant includes charts for end of life memory cells (i.e., after a particular number of read cycles performed on the cell) encoded with the MLC1 state, the lower left quadrant includes charts for early life memory cells encoded with the SET state, and the lower right quadrant includes charts for end of life memory cells encoded with the SET state. In each chart, there are two plotted lines: one to represent the VDM of the cells right after placement (i.e., being encoded with the memory state) and one for the first read of the cell after placement. As shown in FIG. 9, both of these lines are closer to one another for the bitline first and wordline first algorithms than in the simultaneous ramping algorithm, indicating a lower disturbance of the memory cell state caused by the reads. In addition, as shown, there are no "tails" in the plots below the 3 sigma mark, indicating that error correction can be performed to correct any potential errors caused by the BER.

Figure 10:
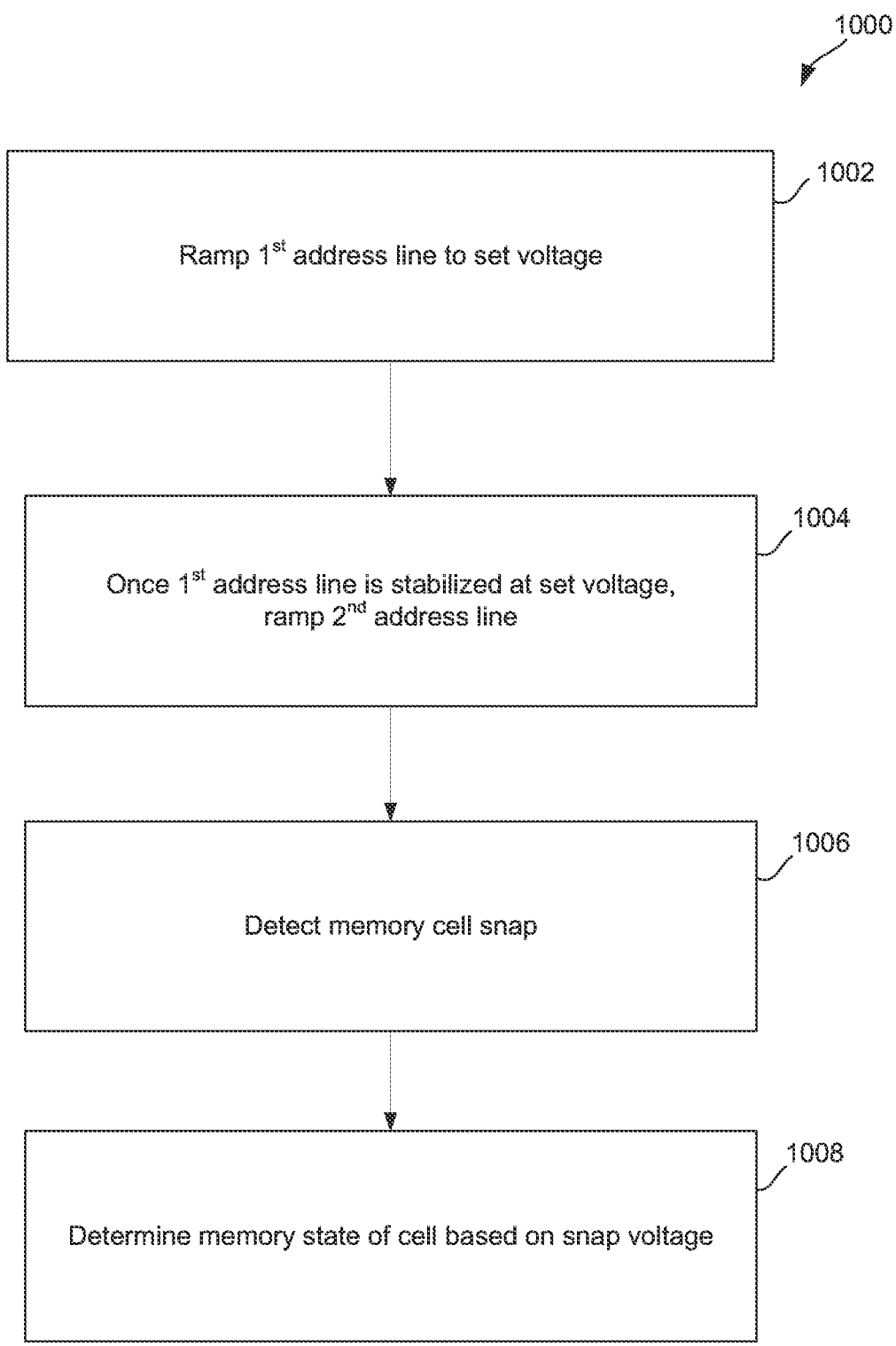
FIG. 10 illustrates an example of a process for reading a state in a memory cell with a crystalline PM region in accordance with embodiments of the present disclosure.

FIG. 10 illustrates an example of a process 1000 for reading a state in a memory cell with a crystalline PM region (e.g., the SET or MLC1 states described above) in accordance with embodiments of the present disclosure. The example process 1000 of FIG. 10 may be performed by way of example at the memory partition controller 210 of FIG. 2, at the memory controller of the CPU, or in a distributed manner across a number of controllers. Further, the flow described in FIG. 10 is merely representative of operations that may occur in particular embodiments. In other embodiments, additional operations may be performed by the components of system 100. Various embodiments of the present disclosure contemplate any suitable signaling mechanisms for accomplishing the functions described herein. Some of the operations illustrated in FIG. 10 may be repeated, combined, modified, or deleted where appropriate. Additionally, operations may be performed in any suitable order without departing from the scope of particular embodiments.

The operations below described below relate to the application of currents to the memory cell, and it will be understood that the application of such currents may be done via application of certain voltages across address lines coupled to the memory cell (e.g., by memory controller circuitry).

At 1002, one of the address lines is ramped to a particular set voltage. For example, in a bitline first algorithm (e.g., as shown in FIG. 7), the bitline may be ramped first until it reaches 3.7V, while the wordline is kept at 0V. As another example, in a wordline first algorithm (e.g., as shown in FIG. 8), the wordline may be ramped first until it reaches −3.3V, while the bitline is kept at 0V.

At 1004, once the address line ramped at 1002 is stabilized at the set voltage, the other address line is ramped. For example, in the bitline first algorithm, after the bitline is set and stabilized at 3.7V, the wordline is then ramped to −3.3V. As another example, in the wordline first algorithm, after the wordline is set and stabilized at −3.3V, the bitline is then ramped to 3.7V.

At 1006, during the ramping of the second address line at 1004, the memory cell may "snap" once the differential voltage between the address lines reaches a particular voltage (i.e., the threshold or demarcation voltage (VDM)) and the snap is detected. Prior to the snap, current does not flow in the cell; however, once the differential voltage reaches the threshold/demarcation voltage, current begins to flow in the cell, causing a drop in the differential voltage between the two address lines.

At 1008, a state of the memory cell is determined based on the differential voltage across the two address lines at the time of the cell snapping. As described above, the SET state may have a lower demarcation voltage than the MLC1 state. In some cases, each state may have a range of demarcation voltages at which the state is indicated. For example, the SET state demarcation voltage range may be between approximately 5.4-6.5V (e.g., 5.7-6.2V) and the MLC1 demarcation voltage range may be between approximately 6.1-7V (e.g., 6.3-6.8V) in certain embodiments.

In some instances, however, the cell may not snap during 1004, e.g., where the cell is in a state other than the SET or MLC1 states described herein. In such a case, the read process 1000 may terminate, and another read process may be implemented to determine whether the memory cell is in another state, e.g., the MLC2 or RST states described above.

Tables 1 and 2 below describe example voltage ramps and corresponding memory cell currents to read a memory cell with crystalline PM region. In particular, Table 1 shows a bitline first algorithm, and Table 2 shows a wordline first algorithm. The "effective" time shown below may refer to an effective amount of time in which the second line is ramped, as a cell in the SET or MLC1 state will snap during the prescribed 20 ns time period.

TABLE 1

Example voltage ramps and corresponding memory cell currents to read a memory cell with crystalline PM region

|  | Voltage | Current | Time |
| --- | --- | --- | --- |
| Ramp bitline | BL = 0 --> 3.7 V<br>WL = 0 V | 27 uA | 20 ns |
| Ramp wordline | BL = 3.7 V<br>WL = 0 --> −3.3 V | 27 uA | 20 ns<br>(effective<br>~10 ns) |

TABLE 2

Example voltage ramps and corresponding memory cell currents to read a memory cell with crystalline PM region

|  | Voltage | Current | Time |
| --- | --- | --- | --- |
| Ramp wordline | BL = 0 V<br>WL = 0 --> −3.3 V | 27 uA | 20 ns |
| Ramp bitline | BL = 0 --> 3.7 V<br>WL = −3.3 V | 27 uA | 20 ns<br>(effective<br>~10 ns) |

A design may go through various stages, from creation to simulation to fabrication. Data representing a design may represent the design in a number of manners. First, as is useful in simulations, the hardware may be represented using a hardware description language (HDL) or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In some implementations, such data may be stored in a database file format such as Graphic Data System II (GDS II), Open Artwork System Interchange Standard (OASIS), or similar format.

In some implementations, software based hardware models, and HDL and other functional description language objects can include register transfer language (RTL) files, among other examples. Such objects can be machine-parsable such that a design tool can accept the HDL object (or model), parse the HDL object for attributes of the described hardware, and determine a physical circuit and/or on-chip layout from the object. The output of the design tool can be used to manufacture the physical device. For instance, a design tool can determine configurations of various hardware and/or firmware elements from the HDL object, such as bus widths, registers (including sizes and types), memory blocks, physical link paths, fabric topologies, among other attributes that would be implemented in order to realize the system modeled in the HDL object. Design tools can include tools for determining the topology and fabric configurations of system on chip (SoC) and other hardware device. In some instances, the HDL object can be used as the basis for developing models and design files that can be used by manufacturing equipment to manufacture the described hardware. Indeed, an HDL object itself can be provided as an input to manufacturing system software to cause the described hardware.

In any representation of the design, the data may be stored in any form of a machine readable medium. A memory or a magnetic or optical storage such as a disc may be the machine readable medium to store information transmitted via optical or electrical wave modulated or otherwise generated to transmit such information. When an electrical carrier wave indicating or carrying the code or design is transmitted, to the extent that copying, buffering, or re-transmission of the electrical signal is performed, a new copy is made. Thus, a communication provider or a network provider may store on a tangible, machine-readable storage medium, at least temporarily, an article, such as information encoded into a carrier wave, embodying techniques of embodiments of the present disclosure.

A module as used herein refers to any combination of hardware, software, and/or firmware. As an example, a module includes hardware, such as a micro-controller, associated with a non-transitory medium to store code adapted to be executed by the micro-controller. Therefore, reference to a module, in one embodiment, refers to the hardware, which is specifically configured to recognize and/or execute the code to be held on a non-transitory medium. Furthermore, in another embodiment, use of a module refers to the non-transitory medium including the code, which is specifically adapted to be executed by the microcontroller to perform predetermined operations. And as can be inferred, in yet another embodiment, the term module (in this example) may refer to the combination of the microcontroller and the non-transitory medium. Often module boundaries that are illustrated as separate commonly vary and potentially overlap. For example, a first and a second module may share hardware, software, firmware, or a combination thereof, while potentially retaining some independent hardware, software, or firmware. In one embodiment, use of the term logic includes hardware, such as transistors, registers, or other hardware, such as programmable logic devices.

Logic may be used to implement any of the functionality of the various components such as CPU 102, external I/O controller 104, processor 108, cores 114A and 114B, I/O controller 110, CPU memory controller 112, storage device 106, system memory device 107, memory chip 116, storage device controller 118, address translation engine 120, memory partition 122, program control logic 124, chip controller 126, memory array 206, memory partition controller 310, word line control logic 314, bit line control logic 316, or other entity or component described herein, or subcomponents of any of these. "Logic" may refer to hardware, firmware, software and/or combinations of each to perform one or more functions. In various embodiments, logic may include a microprocessor or other processing element operable to execute software instructions, discrete logic such as an application specific integrated circuit (ASIC), a programmed logic device such as a field programmable gate array (FPGA), a storage device containing instructions, combinations of logic devices (e.g., as would be found on a printed circuit board), or other suitable hardware and/or software. Logic may include one or more gates or other circuit components. In some embodiments, logic may also be fully embodied as software. Software may be embodied as a software package, code, instructions, instruction sets and/or data recorded on non-transitory computer readable storage medium. Firmware may be embodied as code, instructions or instruction sets and/or data that are hard-coded (e.g., nonvolatile) in storage devices.

Use of the phrase 'to' or 'configured to,' in one embodiment, refers to arranging, putting together, manufacturing, offering to sell, importing, and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'capable of/to,' and or 'operable to,' in one embodiment, refers to some apparatus, logic, hardware, and/or element designed in such a way to enable use of the apparatus, logic, hardware, and/or element in a specified manner. Note as above that use of to, capable to, or operable to, in one embodiment, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1's and 0's, which simply represents binary logic states. For example, a 1 refers to a high logic level and 0 refers to a low logic level. In one embodiment, a storage cell, such as a transistor or flash cell, may be capable of holding a single logical value or multiple logical values. However, other representations of values in computer systems have been used. For example, the decimal number ten may also be represented as a binary value of 1010 and a hexadecimal letter A. Therefore, a value includes any representation of information capable of being held in a computer system.

Moreover, states may be represented by values or portions of values. As an example, a first value, such as a logical one, may represent a default or initial state, while a second value, such as a logical zero, may represent a non-default state. In addition, the terms reset and set, in one embodiment, refer to a default and an updated value or state, respectively. For example, a default value potentially includes a high logical value, i.e. reset, while an updated value potentially includes a low logical value, i.e. set. Note that any combination of values may be utilized to represent any number of states.

The embodiments of methods, hardware, software, firmware, or code set forth above may be implemented via instructions or code stored on a machine-accessible, machine readable, computer accessible, or computer readable medium which are executable by a processing element. A non-transitory machine-accessible/readable medium includes any mechanism that provides (i.e., stores and/or transmits) information in a form readable by a machine, such as a computer or electronic system. For example, a non-transitory machine-accessible medium includes random-access memory (RAM), such as static RAM (SRAM) or dynamic RAM (DRAM); ROM; magnetic or optical storage medium; flash storage devices; electrical storage devices; optical storage devices; acoustical storage devices; other form of storage devices for holding information received from transitory (propagated) signals (e.g., carrier waves, infrared signals, digital signals); etc., which are to be distinguished from the non-transitory mediums that may receive information there from.

Instructions used to program logic to perform embodiments of the disclosure may be stored within a memory in the system, such as DRAM, cache, flash memory, or other storage. Furthermore, the instructions can be distributed via a network or by way of other computer readable media. Thus a The machine-readable storage medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage medium used in the transmission of information over the Internet via electrical, optical, acoustical or other forms of propagated signals (e.g., carrier waves, infrared signals, digital signals, etc.). Accordingly, the computer-readable medium includes any type of tangible machine-readable storage medium suitable for storing or transmitting electronic instructions or information in a form readable by a machine (e.g., a computer).

Some examples of embodiments are provided below.

Example 1 includes a non-volatile memory device comprising: a memory array comprising: a plurality of non-volatile memory cells, each memory cell comprising a phase change material (PM) region and a select device (SD) region in series with the PM region; and address lines to apply voltages across the memory cells, wherein each memory cell has a corresponding address line pair to apply voltages thereto; memory controller circuitry to interface with the address lines of the memory cells, the memory controller circuitry to read a state in a memory cell by: ramping a voltage applied to a first address line of the address line pair corresponding to the memory cell until the first address line voltage is stabilized at a predetermined voltage; ramping a voltage applied to a second address line of the address line pair corresponding to the memory cell; detecting a snap in the memory cell while ramping the voltage applied to the second address line; and determining a state of the memory cell based on a differential voltage between the first and second address lines when the memory cell snap occurred.

Example 2 includes the subject matter of Example 1, wherein each address line pair corresponding to a memory cell comprises a wordline and a bitline, the first address line is the wordline and the second address line is the bitline.

Example 3 includes the subject matter of Example 2, wherein the predetermined voltage is between −2.8V and −3.4 V.

Example 4 includes the subject matter of Example 1, wherein each address line pair corresponding to a memory cell comprises a wordline and a bitline, the first address line is the bitline and the second address line is the wordline.

Example 5 includes the subject matter of Example 4, wherein the predetermined voltage is between 3.2V and 3.7V.

Example 6 includes the subject matter of any one of Examples 1-5, wherein the memory controller circuitry is to determine that the memory cell has a crystalline PM region and a crystalline SD region based on the differential voltage between the first and second address lines being between 5.7V and 6.2V.

Example 7 includes the subject matter of any one of Examples 1-5, wherein the memory controller circuitry is to determine that the memory cell has a crystalline PM region and an amorphous SD region based on the differential voltage between the first and second address lines being between 6.3V and 6.8V.

Example 8 includes a memory module comprising: input/output (I/O) circuitry to couple the memory module with an external controller; and a plurality of non-volatile memory devices according to any one of Examples 1-7.

Example 9 includes a method of reading a state in a memory cell comprising a phase change material (PM) region and a select device (SD) region in series, the method comprising: ramping a voltage applied to a first address line of an address line pair corresponding to the memory cell until the first address line voltage is stabilized at a predetermined voltage; ramping a voltage applied to a second address line of the address line pair corresponding to the memory cell; detecting a snap in the memory cell while ramping the voltage applied to the second address line; and determining a state of the memory cell based on a differential voltage between the first and second address lines when the memory cell snap occurred.

Example 10 includes the subject matter of Example 9, wherein each address line pair corresponding to a memory cell comprises a wordline and a bitline, the first address line is the wordline and the second address line is the bitline.

Example 11 includes the subject matter of Example 10, wherein the predetermined voltage is between −2.8V and −3.4 V.

Example 12 includes the subject matter of Example 9, wherein each address line pair corresponding to a memory cell comprises a wordline and a bitline, the first address line is the bitline and the second address line is the wordline.

Example 13 includes the subject matter of Example 12, wherein the predetermined voltage is between 3.2V and 3.7V.

Example 14 includes the subject matter of any one of Examples 9-13, wherein the differential voltage between the first and second address lines is between 5.7V and 6.2V and the determined memory state is a state having a crystalline PM region and a crystalline SD region.

Example 15 includes the subject matter of any one of Examples 9-13, wherein the differential voltage between the first and second address lines is between 6.3V and 6.8V and the determined memory state is a state having a crystalline PM region and an amorphous SD region.

Example 16 includes an apparatus comprising: a memory cell comprising a phase change material (PM) region and a select device (SD) region; and means to read a state of the memory cell by any one of the methods of Examples 9-15.

Example 17 includes a tangible non-transitory machine-readable storage medium having instructions stored thereon, the instructions when executed by a machine to cause the machine to read a state in a memory cell comprising a phase change material (PM) region and a select device (SD) region in series by: ramping a voltage applied to a first address line of an address line pair corresponding to the memory cell until the first address line voltage is stabilized at a predetermined voltage; ramping a voltage applied to a second address line of the address line pair corresponding to the memory cell; detecting a snap in the memory cell while ramping the voltage applied to the second address line; and determining a state of the memory cell based on a differential voltage between the first and second address lines when the memory cell snap occurred.

Example 18 includes the subject matter of Example 17, wherein each address line pair corresponding to a memory cell comprises a wordline and a bitline, the first address line is the wordline and the second address line is the bitline.

Example 19 includes the subject matter of Example 18, wherein the predetermined voltage is between −2.8V and −3.4 V.

Example 20 includes the subject matter of Example 17, wherein each address line pair corresponding to a memory cell comprises a wordline and a bitline, the first address line is the bitline and the second address line is the wordline.

Example 21 includes the subject matter of Example 20, wherein the predetermined voltage is between 3.2V and 3.7V.

Example 22 includes the subject matter of any one of Examples 17-21, wherein the instructions are to determine that the memory cell has a crystalline PM region and a crystalline SD region based on the differential voltage between the first and second address lines being between 5.7V and 6.2V.

Example 23 includes the subject matter of any one of Examples 17-21, wherein the instructions are to determine that the memory cell has a crystalline PM region and an amorphous SD region based on the differential voltage between the first and second address lines being between 6.3V and 6.8V.

Example 24 includes a device comprising: one or more processors and one or more computer-readable media comprising instructions that, when executed by the one or more processors, cause the one or more processors to perform the method, techniques, or process as described in or related to any of the Examples above, or portions thereof Example 25 includes a computer program comprising instructions, wherein execution of the program by a processing element is to cause the processing element to carry out the method, techniques, or process as described in or related to any of the Examples above, or portions thereof.

Example 26 includes a memory controller comprising circuitry interface with address lines of a memory cell comprising a phase change material (PM) region and a select device (SD) region in series, the circuitry to read a state in a memory cell by: ramping a voltage applied to a first address line of an address line pair corresponding to the memory cell until the first address line voltage is stabilized at a predetermined voltage; ramping a voltage applied to a second address line of the address line pair corresponding to the memory cell; detecting a snap in the memory cell while ramping the voltage applied to the second address line; and determining a state of the memory cell based on a differential voltage between the first and second address lines when the memory cell snap occurred.

Example 27 includes the subject matter of Example 26, wherein each address line pair corresponding to a memory cell comprises a wordline and a bitline, the first address line is the wordline and the second address line is the bitline.

Example 28 includes the subject matter of Example 27, wherein the predetermined voltage is between −2.8V and −3.4 V.

Example 29 includes the subject matter of Example 26, wherein each address line pair corresponding to a memory cell comprises a wordline and a bitline, the first address line is the bitline and the second address line is the wordline.

Example 30 includes the subject matter of Example 29, wherein the predetermined voltage is between 3.2V and 3.7V.

Example 31 includes the subject matter of any one of Examples 26-30, wherein the memory controller circuitry is to determine that the memory cell has a crystalline PM region and a crystalline SD region based on the differential voltage between the first and second address lines being between 5.7V and 6.2V.

Example 32 includes the subject matter of any one of Examples 26-30, wherein the memory controller circuitry is to determine that the memory cell has a crystalline PM region and an amorphous SD region based on the differential voltage between the first and second address lines being between 6.3V and 6.8V.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the foregoing specification, a detailed description has been given with reference to specific example embodiments. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but may refer to different and distinct embodiments, as well as potentially the same embodiment.

What is claimed is:

1. A non-volatile memory device comprising:
a memory array comprising:
a plurality of non-volatile memory cells, each memory cell comprising a phase change material (PM) region and a select device (SD) region in series with the PM region; and
address lines to apply voltages across the memory cells, wherein each memory cell has a corresponding address line pair to apply voltages thereto; and
memory controller circuitry to interface with the address lines of the memory cells, the memory controller circuitry to read a state in a memory cell by:
ramping a voltage applied to a first address line of the address line pair corresponding to the memory cell until the first address line voltage is stabilized at a predetermined voltage;
ramping a voltage applied to a second address line of the address line pair corresponding to the memory cell;
detecting a snap in the memory cell while ramping the voltage applied to the second address line; and determining a state of the memory cell based on a differential voltage between the first and second address lines when the memory cell snap occurred.

2. The memory device of claim 1, wherein each address line pair corresponding to a memory cell comprises a wordline and a bitline, the first address line is the wordline and the second address line is the bitline.

3. The memory device of claim 2, wherein the predetermined voltage is between −2.8V and −3.4 V.

4. The memory device of claim 1, wherein each address line pair corresponding to a memory cell comprises a wordline and a bitline, the first address line is the bitline and the second address line is the wordline.

5. The memory device of claim 4, wherein the predetermined voltage is between 3.2V and 3.7V.

6. The memory device of claim 1, wherein the memory controller circuitry is to:
   determine that the memory cell has a crystalline PM region and a crystalline SD region based on the differential voltage between the first and second address lines being between 5.7V and 6.2V; and
   determine that the memory cell has a crystalline PM region and an amorphous SD region based on the differential voltage between the first and second address lines being between 6.3V and 6.8V.

7. A memory module comprising:
input/output (I/O) circuitry to couple the memory module with an external controller; and
a plurality of non-volatile memory devices, each memory device comprising:
   a plurality of non-volatile memory cells, each memory cell comprising a phase change material (PM) region and a select device (SD) region in series with the PM region;
   address lines to apply voltages across the memory cells, wherein each memory cell has a corresponding address line pair to apply voltages thereto; and
   memory controller circuitry to interface with the address lines of the memory cells, the memory controller circuitry to read a state in a memory cell by:
      ramping a voltage applied to a first address line of the address line pair corresponding to the memory cell until the first address line voltage is stabilized at a predetermined voltage;
      ramping a voltage applied to a second address line of the address line pair corresponding to the memory cell;
      detecting a snap in the memory cell while ramping the voltage applied to the second address line; and
      determining a state of the memory cell based on a differential voltage between the first and second address lines when the memory cell snap occurred.

8. The memory module of claim 7, wherein each address line pair corresponding to a memory cell comprises a wordline and a bitline, the first address line is the wordline and the second address line is the bitline.

9. The memory module of claim 8, wherein the predetermined voltage is between −2.8V and −3.4 V.

10. The memory module of claim 7, wherein each address line pair corresponding to a memory cell comprises a wordline and a bitline, the first address line is the bitline and the second address line is the wordline.

11. The memory module of claim 10, wherein the predetermined voltage is between 3.2V and 3.7V.

12. The memory module of claim 7, wherein the memory controller circuitry is to:
   determine that the memory cell has a crystalline PM region and a crystalline SD region based on the differential voltage between the first and second address lines being between 5.7V and 6.2V; and
   determine that the memory cell has a crystalline PM region and an amorphous SD region based on the differential voltage between the first and second address lines being between 6.3V and 6.8V.

13. A memory controller comprising:
circuitry interface with address lines of a memory cell comprising a phase change material (PM) region and a select device (SD) region in series, the circuitry to read a state in a memory cell by:
   ramping a voltage applied to a first address line of an address line pair corresponding to the memory cell until the first address line voltage is stabilized at a predetermined voltage;
   ramping a voltage applied to a second address line of the address line pair corresponding to the memory cell;
   detecting a snap in the memory cell while ramping the voltage applied to the second address line; and
   determining a state of the memory cell based on a differential voltage between the first and second address lines when the memory cell snap occurred.

14. The memory controller of claim 13, wherein each address line pair corresponding to a memory cell comprises a wordline and a bitline, the first address line is the wordline and the second address line is the bitline.

15. The memory controller of claim 14, wherein the predetermined voltage is between −2.8V and −3.4 V.

16. The memory controller of claim 13, wherein each address line pair corresponding to a memory cell comprises a wordline and a bitline, the first address line is the bitline and the second address line is the wordline.

17. The memory controller of claim 16, wherein the predetermined voltage is between 3.2V and 3.7V.

18. The memory controller of claim 13, wherein the circuitry is to:
   determine that the memory cell has a crystalline PM region and a crystalline SD region based on the differential voltage between the first and second address lines being between 5.7V and 6.2V; and
   determine that the memory cell has a crystalline PM region and an amorphous SD region based on the differential voltage between the first and second address lines being between 6.3V and 6.8V.

19. A method of reading a state in a memory cell comprising a phase change material (PM) region and a select device (SD) region in series, the method comprising:
   ramping a voltage applied to a first address line of an address line pair corresponding to the memory cell until the first address line voltage is stabilized at a predetermined voltage;
   ramping a voltage applied to a second address line of the address line pair corresponding to the memory cell;
   detecting a snap in the memory cell while ramping the voltage applied to the second address line; and
   determining a state of the memory cell based on a differential voltage between the first and second address lines when the memory cell snap occurred.

20. The method of claim 19, wherein each address line pair corresponding to a memory cell comprises a wordline and a bitline, the first address line is the wordline and the second address line is the bitline.

21. The method of claim 20, wherein the predetermined voltage is between −2.8V and −3.4 V.

22. The method of claim 19, wherein each address line pair corresponding to a memory cell comprises a wordline and a bitline, the first address line is the bitline and the second address line is the wordline.

23. The method of claim 22, wherein the predetermined voltage is between 3.2V and 3.7V.

24. The method of claim 19, wherein the differential voltage between the first and second address lines is between 5.7V and 6.2V and the determined memory state is a state having a crystalline PM region and a crystalline SD region.

25. The method of claim 19, wherein the differential voltage between the first and second address lines is between 6.3V and 6.8V and the determined memory state is a state having a crystalline PM region and an amorphous SD region.

* * * * *